(12) United States Patent
Myers

(10) Patent No.: US 7,593,383 B1
(45) Date of Patent: Sep. 22, 2009

(54) UPLINK TRANSMITTER IN A RANDOM PHASE MULTIPLE ACCESS COMMUNICATION SYSTEM

(75) Inventor: Theodore J. Myers, San Diego, CA (US)

(73) Assignee: On-Ramp Wireless, Inc., San Diego, CA (US)

( * ) Notice: Subject to any disclaimer, the term of this patent is extended or adjusted under 35 U.S.C. 154(b) by 0 days.

(21) Appl. No.: 12/189,619

(22) Filed: Aug. 11, 2008

Related U.S. Application Data

(60) Provisional application No. 61/037,522, filed on Mar. 18, 2008.

(51) Int. Cl.
*H04B 7/216* (2006.01)
*H04B 1/00* (2006.01)

(52) U.S. Cl. .................. 370/342; 370/320; 370/335; 375/146

(58) Field of Classification Search ......... 370/203–209, 370/319–320, 328, 335, 338, 342–344, 441, 370/478–480; 375/130–150
See application file for complete search history.

(56) References Cited

U.S. PATENT DOCUMENTS

| | | | |
|---|---|---|---|
| 4,774,715 A | 9/1988 | Messenger | |
| 5,297,162 A * | 3/1994 | Lee et al. | 375/143 |
| 5,353,300 A * | 10/1994 | Lee et al. | 370/342 |
| 5,359,624 A | 10/1994 | Lee et al. | |
| 5,596,330 A | 1/1997 | Yokev et al. | |
| 6,011,974 A | 1/2000 | Cedervall et al. | |
| 6,069,915 A * | 5/2000 | Hulbert | 375/150 |
| 6,108,565 A | 8/2000 | Scherzer | |
| 6,111,911 A | 8/2000 | Sanderford, Jr. et al. | |
| 6,157,631 A | 12/2000 | Rohani | |
| 6,256,337 B1 | 7/2001 | Hendrickson et al. | |
| 6,278,725 B1 | 8/2001 | Rouphael et al. | |
| 6,363,106 B1 | 3/2002 | Popovic et al. | |
| 6,459,402 B1 | 10/2002 | Tsunehara et al. | |
| 6,647,077 B1 * | 11/2003 | Shan et al. | 375/346 |
| 6,701,132 B1 | 3/2004 | Fukuzawa et al. | |
| 6,704,547 B2 | 3/2004 | Kuwahara et al. | |
| 6,724,810 B1 | 4/2004 | Chapman | |

(Continued)

FOREIGN PATENT DOCUMENTS

| | | |
|---|---|---|
| KR | 20020001071 | 1/2002 |
| KR | 20050022433 | 3/2005 |
| WO | WO 2005/010214 | 2/2005 |

OTHER PUBLICATIONS

Pottie, "Wireless Multiple Access Adaptive Communications Techniques", retrieved from Internet: http://www.ee.ucla.edu/~pottie/papers/encyc1.pdf.

(Continued)

*Primary Examiner*—Tri H Phan
(74) *Attorney, Agent, or Firm*—Foley & Lardner LLP

(57) ABSTRACT

A method for communicating through a multiple access communication interface includes receiving a first signal from a first tag, where the first signal is spread using a predetermined pseudo-noise (PN) code, and further where the first signal includes first payload data. A second signal is received from a second tag. The second signal is spread using the predetermined PN code, and the second signal includes second payload data. The first payload data from the first signal is identified at least in part with a PN array despreader. The second payload data from the second signal is also identified at least in part with the PN array despreader.

20 Claims, 16 Drawing Sheets

U.S. PATENT DOCUMENTS

| | | | |
|---|---|---|---|
| 6,748,224 | B1 | 6/2004 | Chen et al. |
| 6,882,682 | B1* | 4/2005 | Tanaka ......................... 375/150 |
| 6,895,036 | B2 | 5/2005 | Medlock |
| 6,900,753 | B2 | 5/2005 | Tsunehara et al. |
| 6,970,518 | B2 | 11/2005 | Kuffner et al. |
| 7,027,485 | B2 | 4/2006 | Yue |
| 7,046,717 | B2 | 5/2006 | Kanterakis et al. |
| 7,050,485 | B2 | 5/2006 | Yue |
| 7,076,008 | B2 | 7/2006 | Jeong |
| 7,085,246 | B1 | 8/2006 | LaRosa et al. |
| 7,113,496 | B2 | 9/2006 | Koo et al. |
| 7,206,797 | B2 | 4/2007 | Gressel et al. |
| 7,218,901 | B1 | 5/2007 | Mobley et al. |
| 7,239,867 | B2 | 7/2007 | Kotzin et al. |
| 7,280,581 | B2 | 10/2007 | Khan |
| 7,302,009 | B2 | 11/2007 | Walton et al. |
| 7,302,276 | B2 | 11/2007 | Bernhardsson et al. |
| 7,321,601 | B2 | 1/2008 | Rogerson et al. |
| 7,526,013 | B1* | 4/2009 | Myers ......................... 375/149 |
| 2001/0004373 | A1 | 6/2001 | Hirata |
| 2001/0041536 | A1 | 11/2001 | Hasegawa |
| 2003/0026219 | A1 | 2/2003 | Moon et al. |
| 2004/0091034 | A1 | 5/2004 | Shiu et al. |
| 2004/0202137 | A1 | 10/2004 | Gerakoulis |
| 2004/0229640 | A1 | 11/2004 | Wang et al. |
| 2004/0252668 | A1 | 12/2004 | Ozukturk et al. |
| 2004/0252684 | A1 | 12/2004 | Evans et al. |
| 2005/0025111 | A1 | 2/2005 | Soma |
| 2005/0058151 | A1 | 3/2005 | Yeh |
| 2005/0058153 | A1 | 3/2005 | Santhoff et al. |
| 2005/0105597 | A1 | 5/2005 | Hwang et al. |
| 2005/0105598 | A1 | 5/2005 | Kaewell |
| 2005/0123025 | A1 | 6/2005 | Sorrells et al. |
| 2005/0157692 | A1 | 7/2005 | Gerakoulis |
| 2005/0208961 | A1 | 9/2005 | Willenegger |
| 2005/0254467 | A1 | 11/2005 | Li et al. |
| 2005/0254557 | A1 | 11/2005 | Ozluturk et al. |
| 2006/0033658 | A1 | 2/2006 | Camp, Jr. |
| 2006/0056375 | A1 | 3/2006 | Koyama et al. |
| 2006/0242323 | A1 | 10/2006 | Sanderford et al. |
| 2006/0245472 | A1 | 11/2006 | Pan et al. |
| 2007/0014338 | A1 | 1/2007 | Ozluturk et al. |
| 2007/0140386 | A1 | 6/2007 | Howard |
| 2007/0211786 | A1 | 9/2007 | Shattil |
| 2007/0258508 | A1 | 11/2007 | Werb et al. |
| 2007/0286142 | A1 | 12/2007 | Prakash et al. |
| 2008/0032625 | A1 | 2/2008 | Cheung et al. |
| 2008/0036589 | A1 | 2/2008 | Werb et al. |
| 2008/0037431 | A1 | 2/2008 | Werb et al. |
| 2008/0037454 | A1 | 2/2008 | Werb et al. |
| 2008/0037569 | A1 | 2/2008 | Werb et al. |
| 2008/0040509 | A1 | 2/2008 | Werb et al. |
| 2008/0062951 | A1 | 3/2008 | Kanterakis et al. |
| 2008/0089447 | A1 | 4/2008 | Usuda et al. |
| 2008/0130482 | A1 | 6/2008 | Dabak |
| 2008/0130731 | A1 | 6/2008 | Shiu et al. |
| 2008/0182511 | A1 | 7/2008 | Adkins et al. |
| 2008/0232330 | A1 | 9/2008 | Lee et al. |
| 2008/0267126 | A1 | 10/2008 | Vujcic et al. |

OTHER PUBLICATIONS

Zhang, "Design and Implementation of an Optical Code Division Multiple Access System Combined with Dense Wavelength Division Multiplexing", retrieved from Internet: http://www.inue.uni-stuttgart.de/publications/pub_2003/zhang_dissertation.pdf, Dec. 5, 2003.

Prasad, "An Overview of CDMA Evolution Toward Wideband CDMA", retrieved from Internet: http://www.tfe.umu.se/courses/systemteknik/Telesystem/Prasad.pdf, 1998.

Li, "Physical Layer Design for a Spread Spectrum Wireless LAN", retrieved from Internet: http://scholar.lib.vt.edu/theses/public/etd-3014171099642831/etd.pdf, Sep. 12, 1996.

Bayer et al., "Improving the Performance of the Distributed Scheduler in IEEE 802. 16 Mesh Networks." In IEEE vehicular technology conference (VTC 2007-Spring) [online], 2007, p. 1-5, [retrieved on Dec. 3, 2008]. Retrieved from the Internet: <URL: http://www.staff.city.ac.uk/~veselin/publications/Bayer_VTC07. pdf>. Citation available at <URL: http://portal.acm.org/citation.cfm?id=1413939.1413942&coll=GUIDE&dl=GUIDE>(see item 25).

Hamalainen, J., "Cellular Network Planning and Optimization Part VI: WCDMA Basics", Helsinki University of Technology Communications and Networking Department, Jan. 24, 2008. [Retrieved on Jan. 27, 2009], Retrieved from the Internet <URL: http://www.comlab.hut.fi/studies/3275/Cellular_network_planning_and_optimization_part6.pdf.

Cao et al., "Modelling and Performance Analysis of the Distributed Scheduler in IEEE 802. 16 Mesh Mode." In: MobiHoc'05 [online], May 25-27, 2005, p. 78-89, [retrieved on Dec. 3, 2008]. Retrieved from the Internet: <URL: http://lion.cs.uiuc.edu/group_seminar_slides/p78-cao.pdf.>.

Zhao, Y.,"Mobile Phone Location Determination and Its Impact on Intelligent Transportation Systems."In: IEEE Transactions on Intelligent Transportation Systems [online], vol. 1, No. 1, Mar. 2000, p. 55-64, [retrieved on Nov. 11, 2008]. Retrieved from the Internet: <URL: http://www.ss.fpp.edu/~fdimc/laboratorijske_vaje/Inteligentni_transportni_sistemi/Literatura_za_sirjenje_obzorja/ITS_mobile_phone_location_determination. pdf>.

Sunay et al., "Mobile Location Tracking in DS CDMA Networks Using Forward Link Time Difference of Arrival and Its Application to Zone-Based Billing." In: Global Telecommunications Conference, 1999. GLOBECOM '99 [online], vol. 1a, p. 143-147, [retrieved on Nov. 20, 2008]. Retrieved from the Internet: <URL: http://portal.ku.edu.tr/~osunay/papers/GCOM99-geolocation.pdf>. Citation on the Internet: <URL: http://ieeexplore.ieee.org/xpl/freeabs_all.jsp?arnumber=831624>.

Wang et al, "Error Statistics of Closed-Loop Power Control in Multirate DS-CDMA Cellular Systems", IEEE Xplore, [Retreived on Feb. 23, 2009], Retreived from the Internet <URL: http://ieeexplore.ieee.org/Xplore/login.jsp?url=/iel5/7793/21424/00993355.pdf?arnumber=993355>, 2002.

Yang et al, "Software-Defined-Radio-Assisted Adaptive Broadband Frequency Hopping Multicarrier DS-CDM", IEEE Communications Magazine, [Retrievd on Feb. 25, 2009], Retrieved from the Internet <URL: http://ieeexplore.ieee.org/Xplore/login.jsp?url=/ielx5/35/21325/00989783.pdf?arnumber=989783>, Mar. 2002.

Xu, Liang, "Dynamic Fair Scheduling with QoS Constraints in Multimedia Wideband CDMA Cellular Networks", IEEE Transactions on Wireless Communications, vol. 3, No. 1; [Retrieved on Feb. 25, 2009], Retrieved from the Internet <URL: http://ieeexplore.ieee.org/Xplore/login.jsp?url=/ielx5/7693/28152/01259400.pdf?arnumber=1259400, Jan. 2004.

Zhao et al., "Joint Rate and Power Adaptation for Radio Resource Management in Uplink Wideband Code Division Multiple Access Systems", Institution of Engineering and Technology (IET) Communications, vol. 2, No. 4, pp. 562-572, [Retrieved on Feb. 25, 2009], Retrieved from the Internet <URL: http://ieeexplore.ieee.org/Xplore/login.jsp?url=/iel5/4105970/4493350/04493358.pdf?arnumber=4493358>, Jan. 2007.

Buzzi et al., "Joint Receiver and Transmitter Optimization for Energy-Efficient CDMA Communications", To Appear in IEEE JSAC—Special Issue on Multiuser Detection for Advanced Communication Systems and Networks, Presented at 2007 European Wireless Conference and at 2007 IEEE International Symposium on Information Theory, [Retrieved on Feb. 25, 2009], Retrieved from the Internet <URL: http://arxiv.org/PS_cache/arxiv/pdf/0712/0712.1339v1.pdf>, 2007.

* cited by examiner

UPLINK TRANSMITTER IN A RANDOM PHASE MULTIPLE ACCESS COMMUNICATION SYSTEM

CROSS REFERENCE TO RELATED APPLICATIONS

The present application claims priority to U.S. Provisional Application No. 61/037,522, the entire disclosure of which is incorporated herein by reference.

The present application is related to U.S. patent application Ser. No. 12/189,609 entitled "Random Phase Multiple Access Communication Interface System and Method," U.S. patent application Ser. No. 12/189,533 entitled "Despreading Spread Spectrum Data," and U.S. patent application Ser. No. 12/189,505 entitled "Tag Communications with Access Point."

FIELD

Embodiments of the present application relate to the field of communications. More specifically, exemplary embodiments relate to random phase multiple access communication interface systems and methods.

BACKGROUND

A number of modulation techniques have been developed for facilitating communications in a network where multiple users are present. Such techniques include code division multiple access (CDMA), time division multiple access (TDMA), and frequency division multiple access (FDMA). CDMA is a spread-spectrum technology that uses pseudo-random number sequences to modulate incoming data, multiple transmitters transmitting on the same signal, and orthogonal codes (Walsh codes) to correlate different communication channels. TDMA uses time slots to coordinate multiple uplink transmitters that are transmitting in the same sub-slots. Users transmit in rapid succession, one after the other, each using his/her own time slot, allowing multiple stations to share the same transmission medium (e.g., radio frequency channel) while using only a portion of the total available bandwidth. FDMA allocates different users with different carrier frequencies of the radio spectrum.

In addition to modulation techniques, protocols exist for determining how network devices respond when two devices attempt to use a data channel simultaneously (called a collision). CSMA/CD (Carrier Sense Multiple Access/Collision Detection) is used by Ethernet networks to physically monitor the traffic on the line at participating stations. If no transmission is taking place at the time, the particular station can transmit. If two stations attempt to transmit simultaneously, this causes a collision, which is detected by all participating stations. After a random time interval, the stations that collided attempt to transmit again. If another collision occurs, the time intervals from which the random waiting time is selected are increased step by step. This is known as exponential back off.

Existing modulation and collision preventing techniques (including those described above and other known techniques) have a number of inherent disadvantages that limit the capabilities and functionalities of communication systems using them.

SUMMARY

An exemplary embodiment uses a random phase multiple access communication interface. The interface can communicatively connect to systems and devices using spread spectrum modulation methods without the use of orthogonal codes.

An exemplary random phase multiple access communication interface communicatively connects systems and devices using spread spectrum modulation methods. The random selection of chip (or timing) offsets as a multiple access scheme allows for non-coordinated data transmission without needing to be assigned a unique "code." All users transmit using the same PN (pseudo noise) code such that a PN array despreader at the access point can be used. If two signals are received at the access point at the same PN offset (or the sum of the PN offset with the transmission delay in number of chips yields the same value for 2 or more transmissions), then a "collision" has occurred and it may not be possible to demodulate these 2 or more signals. The randomization of timing offsets each time means that any "collisions" that occur only occur during that frame. A retransmission scheme and a new randomized offset is used to get through in the next attempt.

An exemplary embodiment includes a transmitter at the tag (uplink) and a method of transmitting signals from the tag to an access point. Each tag includes its own transmitter which transmits information in the form of frames. A frame can be formed from information provided on a channel having a fixed data rate. The data can be spread using the same pseudo-noise (PN) code, and can have a randomly selected chip offset. The transmitter also applies frequency rotation and sample clock correction to match the reference oscillator of the access point. A plurality of tags is associated with a single access point to form the network. Each of the plurality of tags transmits information using the same PN code along with a randomly selected chip offset. The phase is randomly selected each frame over a large number of chips (i.e., 8192).

Another exemplary embodiment includes a transmitter at an access point (downlink) and a method for transmitting signals from the access point to the tags. The access point transmitter can be similar to that of the tags. However, the access point transmitter uses a unique PN code for each of the tags with which it communicates. The use of distinct PN codes for each tag provides security and allows each tag to ignore signals which are directed toward other tags. The frames transmitted by the access point also include a preamble of approximately 9 symbols to allow for rapid acquisition at the tags.

Another exemplary embodiment includes a demodulator at the tag and a method for demodulating signals received by the tag. An automatic frequency control (AFC) derotator multiplication is applied to signals received at the tag. The AFC derotator multiplication is a 1 bit complex operation with a 1 bit complex output such that gate count is improved. The tag uses a PN array despreader that takes advantage of the huge computational savings in the 1 bit data path.

Another exemplary embodiment includes a demodulator at the access point and a method for demodulating signals received at the access point. The access point demodulator has capacity to simultaneously demodulate several thousand or more links received from tags. To demodulate such a large number of links, the access point demodulator includes a PN array despreader.

Another exemplary embodiment includes synchronization of the tag with a master timing of the access point. The access point can periodically transmit a broadcast frame. During a 'cold' timing acquisition, the tag uses its PN despreader to analyze the broadcast frames and identify the master timing of the access point. Cold timing acquisition is expected to occur one time when the tag is first introduced into the system. After the initial cold acquisition, the tag can perform a 'warm' timing acquisition each time the tag wakes up to transmit or receive a signal. The warm timing acquisition utilizes less power than the cold timing acquisition.

In at least one exemplary embodiment, each tag separately generates a PN code. A gold code is an example of a PN code that is parameterizable such that each user has its own. As such, only data destined for a particular user is visible to it. Using unique PN codes, a tag does not process data that is not its own.

An exemplary method for communicating through a multiple access communication interface includes receiving a first signal from a first tag, where the first signal is spread using a predetermined pseudo-noise (PN) code, and further where the first signal includes first payload data. A second signal is received from a second tag. The second signal is spread using the predetermined PN code, and the second signal includes second payload data. The first payload data from the first signal is identified at least in part with a PN array despreader. The second payload data from the second signal is also identified at least in part with the PN array despreader.

An exemplary system for communicating through a multiple access communication interface includes a first tag, a second tag, and an access point. The first tag has a first transmitter configured to transmit first payload data in a first signal, wherein the first signal is spread using a predetermined pseudo-noise (PN) code. The second tag has a second transmitter configured to transmit second payload data in a second signal, wherein the second signal is spread using the predetermined PN code. The access point is in communication with the first tag and the second tag and includes a receiver and a despread array. The receiver is configured to receive the first signal and the second signal. The despread array is configured to despread the first signal and the second signal.

An exemplary access point for use in a multiple access communication system includes a processor, a receiver in communication with the processor, and a transmitter in communication with the processor. The receiver is configured to receive a first signal from a first tag, wherein the first signal includes first payload data, and further wherein the first signal is spread using a predetermined pseudo-noise (PN) code. The receiver is also configured to receive a second signal from a second tag, wherein the second signal includes second payload data, and further wherein the second signal is spread using the predetermined PN code. The transmitter is configured to transmit a third signal to the first tag, wherein the third signal is spread with a second PN code, and further wherein the second PN code is specific to the first tag.

These and other features, aspects and advantages will become apparent from the following description, appended claims, and the accompanying exemplary embodiments shown in the drawings, which are briefly described below.

DETAILED DESCRIPTION

Exemplary embodiments are described below with reference to the accompanying drawings. It should be understood that the following description is intended to describe exemplary embodiments, and not to limit the invention defined in the appended claims.

Figure 1:
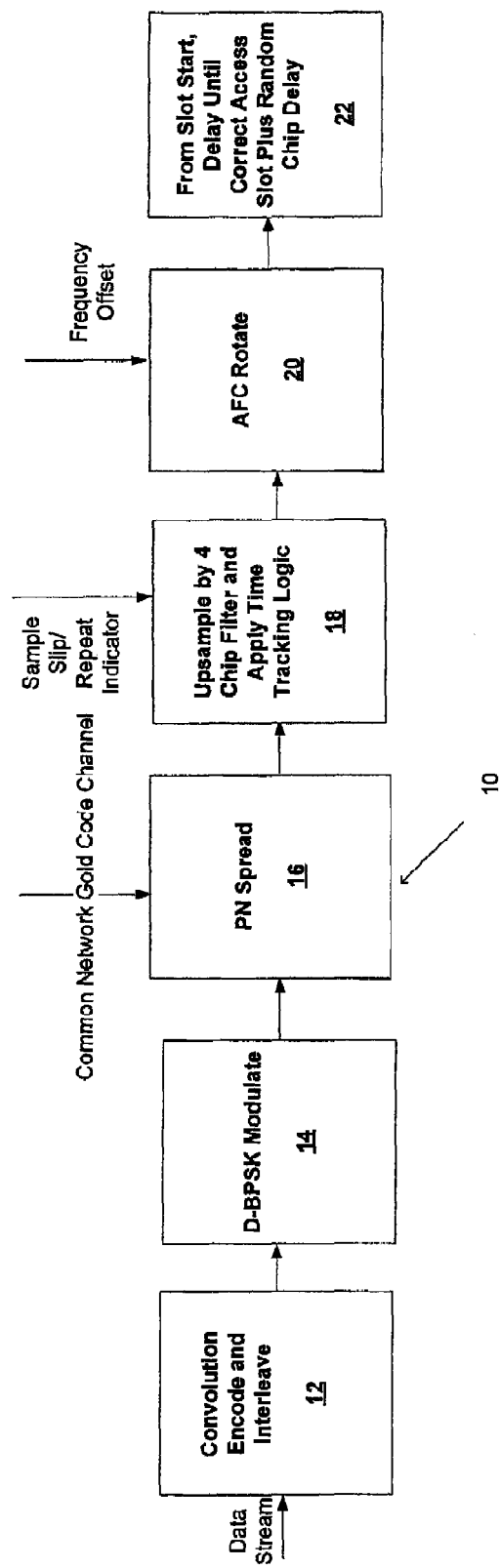
FIG. 1 is a diagram depicting an uplink transmitter according to an exemplary embodiment.

FIG. 1 illustrates an uplink transmitter 10 which includes structures such as a convolution encoder, an interleave module, a modulator, a pseudo-noise spreader, a filter, a bank of taps, an automatic frequency control (AFC) rotator, and other such structures. These structures perform operations depicted in blocks 12, 14, 16, 18, 20, and 22. The transmit path of uplink transmitter 10 is a coded and spread spectrum waveform. In an exemplary embodiment, the uplink transmitter 10 can be included in a tag that communicates with an access point along with other tags using demodulated communication channels. Additional, fewer, or different operations may be performed by the uplink transmitter 10 depending on the particular embodiment. The operations may also be performed in a different order than that shown and described. As used herein, a tag can refer to any communications device configured to receive signals from and/or send signals to an access point. The access point can refer to any communications device configured to simultaneously communicate with a plurality of tags. In an exemplary embodiment, the tags can be mobile, low power devices which run off a battery or other stored power, and the access point can be located in a central location and receive power from a power source such as a wall outlet or generator. Alternatively, the tags may plug into an outlet and/or the access point may run off of a battery or other stored power source.

In block 12, a data stream is received by a convolution encoder and interleave module. In one embodiment, the data stream is 128 Bits including the preamble. Alternatively, data streams of other sizes may be used. Once received, the data stream is encoded using the convolution encoder. In an exemplary embodiment, the data stream may be encoded at a rate of %. Alternatively, other rates may be used. The data stream can also be interleaved using the interleave module. An encoded symbols stream is output to a block 14 in which a differential binary phase shift keying (D-BPSK) modulator is used to modulate the encoded symbols stream. In alternative embodiments, other modulation schemes may be used. At block 16, the modulated stream is applied to a PN spreader. In an exemplary embodiment, the PN spreader can use a common network gold code channel using a selected spreading factor. The spreading factor can be a member of the set {64, 128, 256, . . . , 8192}. Alternatively, any other code and/or spreading factor may be used. Each of the tags at a given spreading factor is spread by the same PN code with a randomly selected chip offset. The large range of possible randomly selected chip offsets increases the probability that a particular frame will not collide (or, in other words, have the same chip timing at the access point) with another frame from another transmitter. The probability of collision in the limit of approaching capacity may become non-negligible (~10% or less) and can be solved via retransmission of the same frame at a differently drawn random offset. The PN spreader is described in more detail below with reference to FIG. 4. In an exemplary embodiment, an output of block 18 can have a rate of 1 bit at 1 mega-chip per second (Mcps). Alternatively, other rates may be used.

At block 18, the data stream is upsampled by a 4×oversample filter and time tracking logic is used to ensure that all of the frames land at the same sample rate consistent with the frequency reference of the AP. Block 18 receives a sample slip/repeat indicator as an input. In one embodiment, an output of block 18 may have a real frequency of approximately 4 megahertz (MHz). At block 20, an automatic frequency control (AFC) rotation is done including a frequency offset to match the access point's timing offset, ensuring that all of the frames from all of the users lands near the same frequency hypothesis. In one embodiment, an output of block 20 may have a complex frequency of approximately 4 MHz. At block 22, a delay is imposed from the start slot until the correct access slot occurs. In addition, a random chip delay is imposed on the signal. In an exemplary embodiment, the random chip delay can be from 0 to the spreading factor minus 1. Alternatively, a different random chip delay may be used. The slot access can be described by A(i,j) where i is related to the spreading factor as $2^{(13-i)}$ and j is the sub-slot number corresponding to non-overlapping slots. Depending upon the selected spreading factor, there are generally multiple transmit opportunities in a given slot. For the uplink, the access slot can be randomly selected along with a chip offset from 0 to spreading factor minus 1. As such, the probability of collision between uplink users is minimized, while allowing for re-selection for cases where there are collisions. After the signal has been delayed, the signal can be transmitted to an access point.

Figure 2:
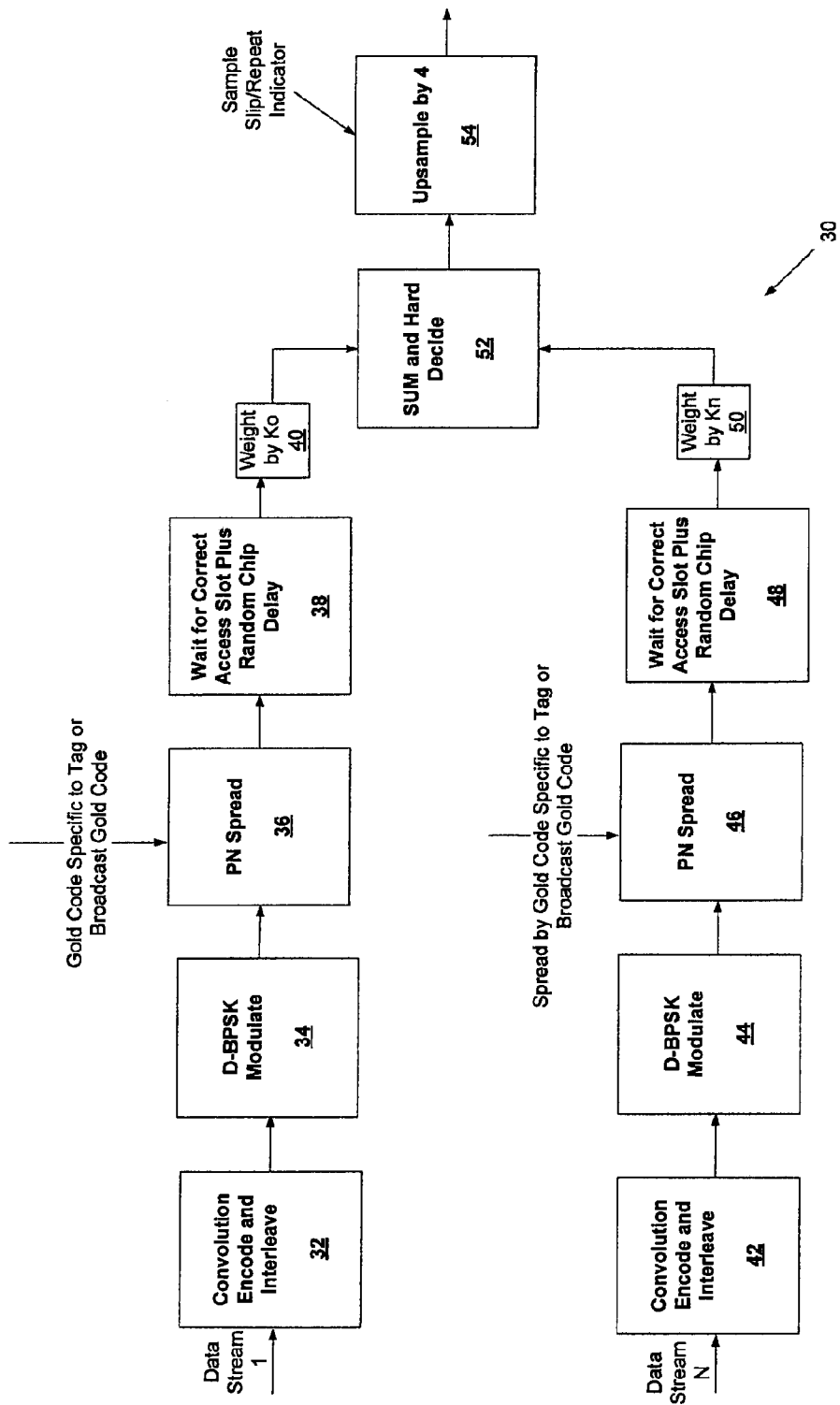
FIG. 2 is a diagram depicting a downlink transmitter according to an exemplary embodiment.

FIG. 2 illustrates a downlink transmitter 30 including structures such as a convolution encoder, an interleave module, a modulator, a pseudo-noise spreader, a filter, a bank of taps, and other such structures. Using transmitter 30, the access point (AP) transmits multiple channels each destined for a particular tag or user. These structures perform operations depicted in blocks 32 through 54. Blocks 32 to 40 and blocks 42 to 50 represent distinct data paths that can be replicated for additional data flows. In an exemplary embodiment, blocks 32-38 can perform operations similar to the operations described with reference to FIG. 1 on a first data stream. Similarly, blocks 42-48 can perform operations similar to the operations described with reference to FIG. 1 on an nth data stream, where n can be any value. The input to block 36 can be a gold code specific to the tag which is to receive the first data stream, and the input to block 46 can be a gold code specific to the tag which is receive the nth data stream. Alternatively, other codes such as a broadcast gold code, a non-gold code, or other may be used to spread the first data stream and/or the nth data stream. The output of block 38 and/or block 48 can be weighted in blocks 40 and 50 in case the data links corresponding to the first data stream and the nth data stream are of unequal power. Once weighted, the paths are summed in a block 52. A hard decision is also made in block 52 where all positive numbers are mapped to 0 and all negative numbers are mapped to 1. Alternatively, a different hard decision may be made. In one embodiment, an output of block 52 may have a rate of 1 bit at 10 Mcps. Alternatively, other rates may be used. The sum output from block 52 is upsampled using a 4×chip filter in block 54. In one embodiment, an output of block 54 can have a real frequency of 40 MHz. Alternatively, other frequencies may be used. Not shown is a transmission on an adjacent frequency that is a single set of broadcast frames at a maximum downlink spreading factor of 2048. Alternatively, a different maximum downlink spreading factor may be used.

Figure 3:
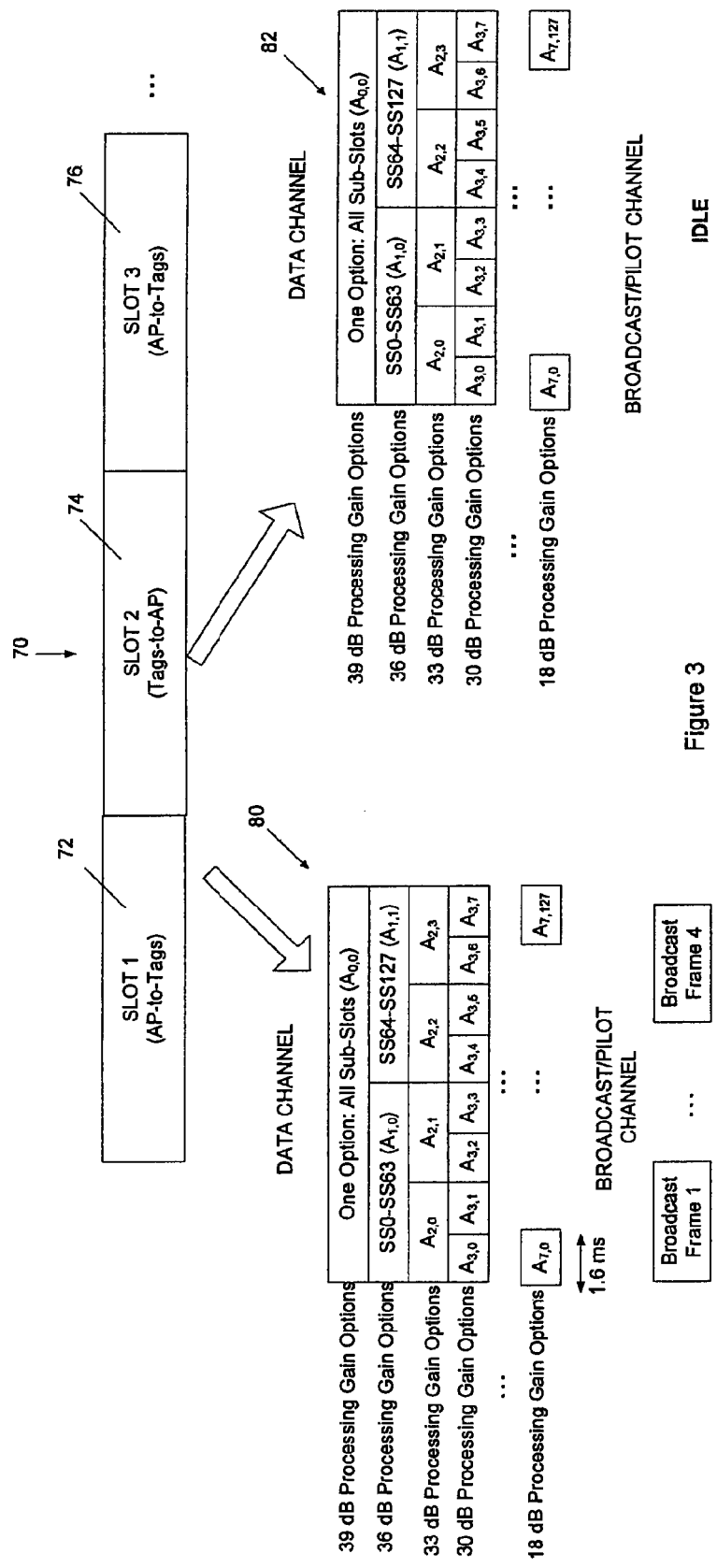
FIG. 3 is a diagram depicting slot structures and assignments in an exemplary embodiment.

FIG. 3 illustrates slot structures and assignments. In at least one embodiment, data stream 70 includes slot 72, slot 74, and slot 76. Slot 72 is an AP-to-tags communication, slot 74 is a tags-to-AP communication, and slot 76 is an AP-to-tags communication. In an exemplary embodiment, each of the slots can have a duration of 2.1 seconds. Alternatively, any other duration may be used and/or different slots may have different durations. The data stream 70 can be implemented in a half-duplex communication scheme such that at any given time, either the AP is transmitting and the tags are receiving, or the tags are transmitting and the AP is receiving. In alternative embodiments, other communication schemes may be used. As shown in FIG. 3, data channel 80 depicts processing gain options for data in slot 72. If a data link closes at a particular gain, the tag only needs to be ready to receive (in AP to tags mode) during the duration of the slot with the corresponding gain. In transmit mode, the slot selection governs the transmission from the tag to the access point such that the tag can minimize its on time in the power consuming transmit mode. For example, a gain of 18 dB only needs a 1.6 ms slot ($A_{7,0}$). Data channel 82 depicts processing gain options for data in slot 74. As can be seen, the power used by a tag can be selected such that each data link arrives at the AP at the same power.

There is a symmetry between processing a large number of simultaneous waveforms on the AP side, and the processing of the relative few waveforms on the tag side. Automatic frequency control (AFC), time-tracking drift, and frame timing are known on the AP side due to the fact that the AP is the master of these parameters. However, AFC, time-tracking drift, and frame timing may be determined at acquisition on the tag side. The PN array despreader performs the brute force operation associated with both, which is an efficient implementation for exploring acquisition hypothesis/demodulating. Another aspect of this is that this large power-consuming circuit (when active), though running continuously on the AP (which shouldn't matter because it can be plugged into the wall), is only running during a "cold" acquisition on the tag which should happen rarely. Cold acquisition and warm acquisition are described in more detail with reference to FIGS. 5 and 6, respectively.

Figure 4:
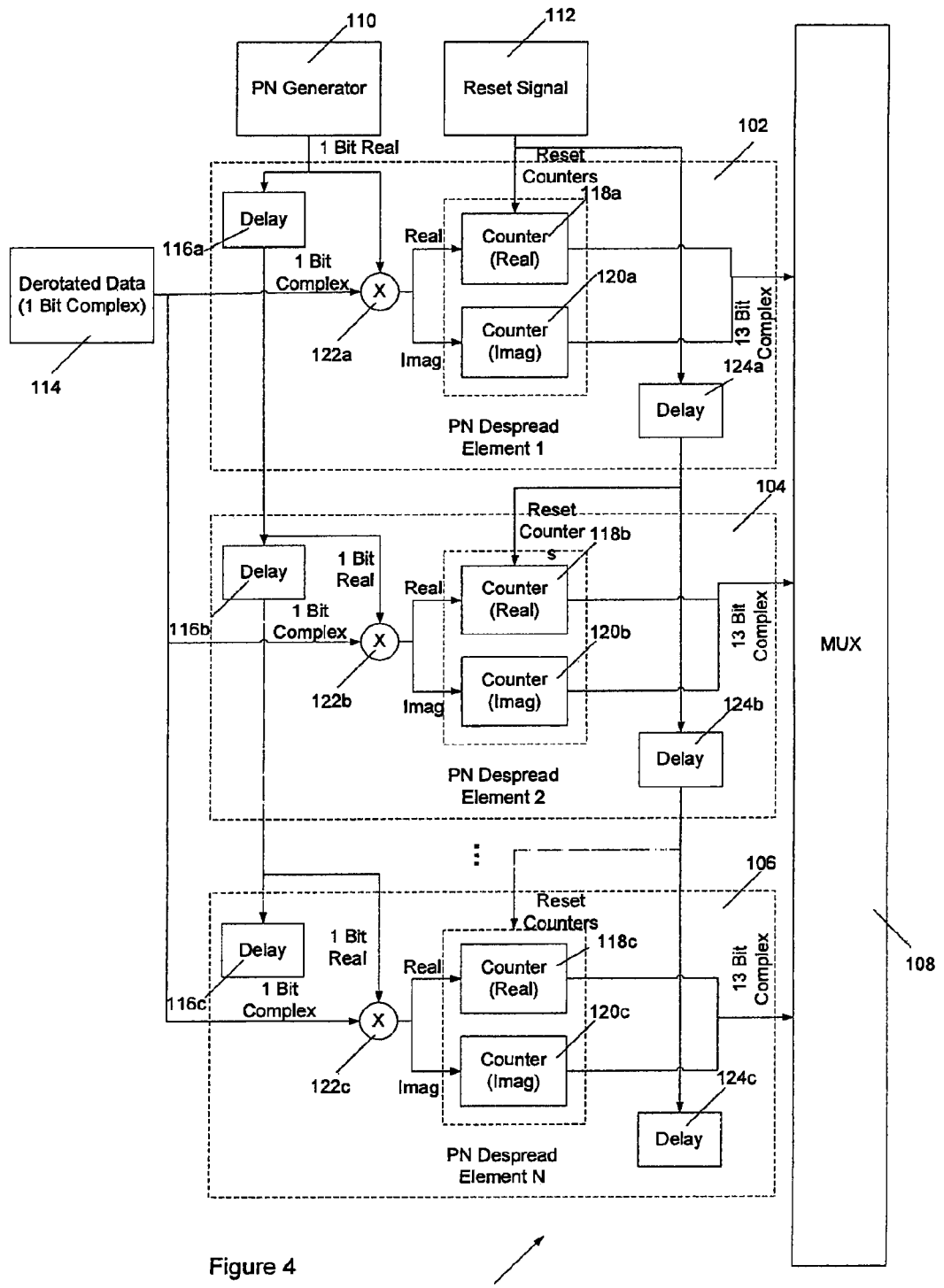
FIG. 4 is a diagram depicting a PN (pseudo noise) despread array in an exemplary embodiment.

FIG. 4 illustrates a PN (pseudo noise) despread array, which facilitates both the acquisition of a single waveform on the tag, and brute-force demodulation of multiple waveforms on the AP. In an exemplary embodiment, the PN despread array can perform a 1 bit dot product of many chip-spaced timing hypotheses simultaneously.

A PN despread core element can be a simple counter that is incremented or not incremented each clock depending on whether the input is a 0 or a 1. Since it is a complex data path, there are two counters: one for I (in-phase) and one for Q (quadrature-phase). Multiplication by a complex exponential is generally a set of 4 rather large scalar multipliers (4×1000 gates is typical) coupled to a complex exponential table. In contrast, a one bit complex multiplier is basically a simple truth table, such as the example table shown below, where the negative denotes the inverse (0→1 and 1→0). This truth table can be implemented using just a few gates.

| Phase | 0 | 1 | 2 | 3 |
|---|---|---|---|---|
| I' | I | −Q | −I | Q |
| Q' | Q | I | −Q | −I |

FIG. 4 depicts a PN despread array 100. There can be many instantiations (e.g., 256 or more in one embodiment) of pairs of counters for the complex despread operation. The PN despread array 100 can be fed at chip rate with adjacent instantiations of PN despread elements 102, 104, and 106 working on timing hypotheses that are a chip apart. The 1 bit complex data is sent from a block 114 to elements 102, 104, and 106 where it is combined with a PN signal from PN generator 110. PN signal generator 110 can be hardware that outputs the same sequence of 0s and 1s with which the AP is spreading the data. In the case of element 102, the derotated data is combined (more specifically, 1 bit complex multiplied) with the PN signal at a combiner 122a. Real and imaginary parts of this combination are separately input into counters 118a and 120a. The counters 118a and 120a shift the bit stream out upon receipt of a reset signal 112. More specifically, the data in the counters is valid just prior to the reset signal. The reset signal forces zeros into both counters. The multiplexer 108 allows for output of the currently valid counters for that finger that has uniquely finished its despreading operation at that particular clock. Other elements in the PN despread array 100 operate similarly. Element 104 receives derotated data from block 114 and combines it with a PN signal after a delay is imposed by delay block 116a in element 102. The combination is entered into counters 118b and 120b, which gets shifted out of the counters upon a signal from the reset signal 112 with an imposed delay from a delay block 124a. Likewise, element 106 receives derotated data from block 114 and combines it with a PN signal after a delay is imposed by delay block 116b in element 104. The combination is entered into counters 118c and 120c, which gets shifted out of the counters upon a signal from the reset signal 112 with an imposed delay from a delay block 124b.

After a number of clocks corresponding to the spreading factor, the PN despread element 102 has valid data which is selected for output by a multiplexer 108. Every clock thereafter, the adjacent despread element 104 or 106 is available until all data has been output which can occur during the number of clocks corresponding to the spreading factor plus a number of PN despread instantiations. The PN code that governs the operation of this mechanism can be a gold code parameterized by a value. In alternative embodiments, other PN codes may be used.

Figure 5:
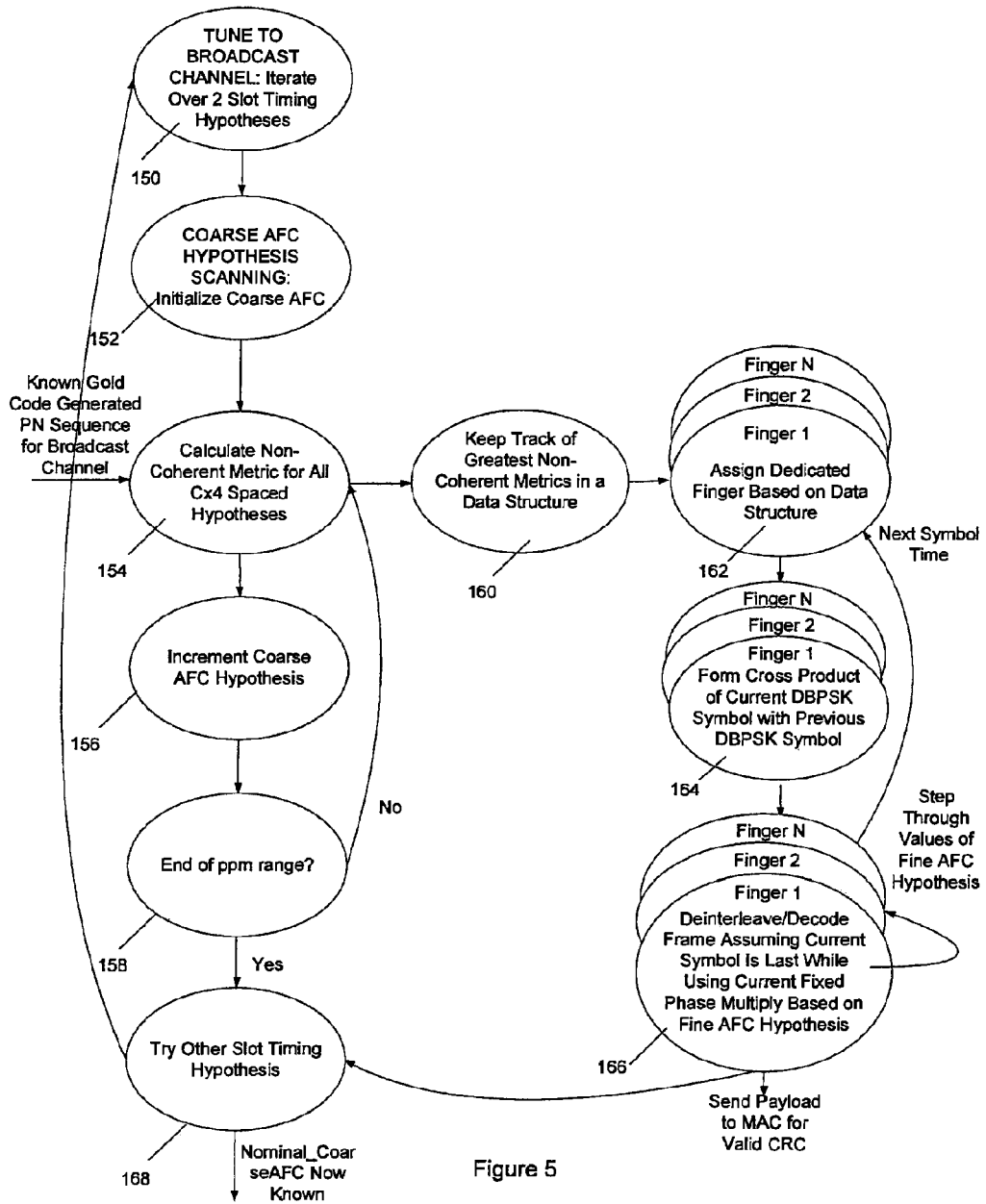
FIG. 5 is a flow diagram depicting operations performed in the tag processing of a broadcast channel from a cold start in an exemplary embodiment.

FIG. 5 illustrates operations performed in the tag modem processing of a broadcast channel to demodulate the access point's transmit waveform. Additional, fewer, or different operations may be performed depending on the particular embodiment. The operations may also be performed in a different sequence than that shown and described.

Upon the initial power-up of the tag, no parameters are known regarding the waveform except for the broadcast channel PN sequence (e.g., the particular gold code or other code parameter). Additionally, the tag may not know with sufficient precision what the relative frequency offset is between the AP and the tag due to oscillator variance between the AP and the tag. FIG. 5 depicts a scanning mode where the range of uncertainty of parts-per-million (ppm) drift between the AP and the tag are explored. In an operation 150, an iteration is made over two slots to enable the tag to tune to a broadcast channel. For example, processing can begin asynchronous to slot timing. During exploration of one half of the hypotheses, the broadcast channel can be active, and during exploration of the other half of the hypothesis the broadcast channel can be inactive. In a first iteration, all hypotheses can be explored using a first slot timing with an asynchronous starting point. If no energy is found in the first iteration, a second iteration is performed. In the second iteration, the asynchronous starting point can have a one slot offset from the asynchronous starting point used in the first iteration. As such, hypotheses that were explored while the broadcast channel was inactive can be explored while the broadcast channel is active. Once the energy is found, the tag can tune to the broadcast channel. In an exemplary embodiment, operation 150 can represent a starting point for 'cold acquisition.' In an operation 152, a coarse automatic frequency (AFC) is initialized. In one embodiment, this initial value is set to a most negative value such as −10 ppm offset. Using a known gold code generated PN sequence for the broadcast channel, in an operation 154, non-coherent metrics for all C×4 spaced hypotheses for a given coarse AFC hypotheses are calculated. For example, if the spreading factor has a length of 2048, the non-coherent metric for 8192 hypotheses can be calculated.

Figure 7:
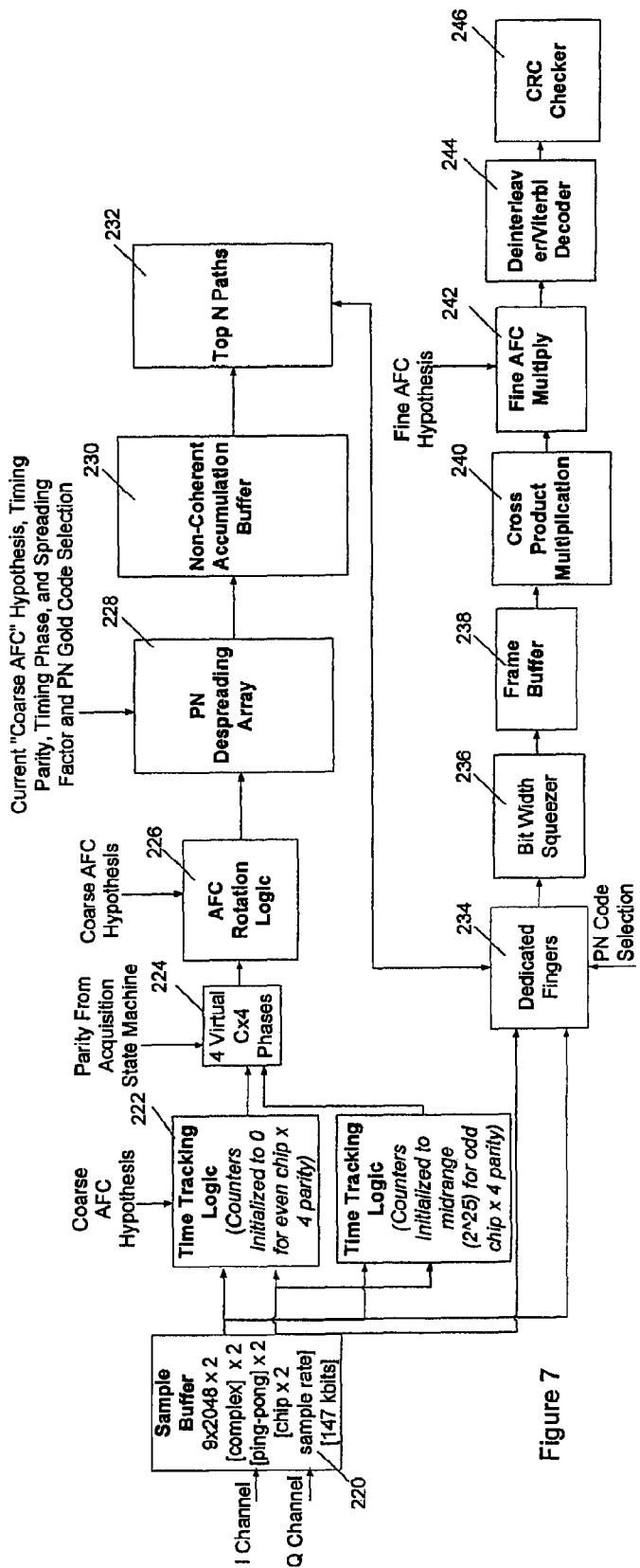
FIG. 7 is a diagram depicting a tag receive data path in an exemplary embodiment.

In operations 156 and 158, the coarse AFC hypothesis is incremented until the end of the ppm range. For each coarse AFC hypothesis, the hardware depicted in FIG. 7 is used to undo the frequency offset represented by the current hypothesis. The PN despread array is used to generate the despread output of 8 successive symbols. Alternatively, other numbers of symbols may be used. A non-coherent sum of these 8 symbols is then calculated. A set of N (8 in the one embodiment) top metrics along with their associated parameters are maintained in a data structure. As the flowchart of FIG. 5 indicates, the entire range of oscillator ppm uncertainty along all the timing hypotheses at chip×4 resolution are explored with the expectation that the winning (i.e., valid) one will be represented in the data structure. Along with the most valid hypothesis there generally tends to be lesser multi-path reflections, adjacent AFC coarse frequency hypotheses where appreciable energy accumulation is still present, as well as entirely invalid hypotheses that have generated anomalously large metrics due to noise variance.

The non-coherent metrics for all chip×4 timing hypotheses for each coarse AFC can be communicated to a data structure. In an operation 160, the data structure keeps track of the greatest non-coherent metrics (e.g., coarse AFC value, chip×4 timing hypothesis, non-coherent metric value). The "finalists" are assigned to the N dedicated fingers in an operation 162. Each finger may be uniquely parameterized by a chip×4 timing value and a coarse AFC hypothesis which is independent of the current coarse AFC hypothesis governing the PN despread array. Since frame timing is initially unknown, each despread symbol that is output by the dedicated finger is hypothesized to be the last in the frame. Thus, the buffered 256 symbols undergo differential demodulation and an additional set of iterations based on multiplying by a constant complex value to perform fine AFC correction, as shown in operations 164 and 166. An output of operation 164 can be a complex cross product from each dedicated finger. In operation 166, a symbol-by-symbol multiplication by a constant complex rotation (as determined by the fine AFC hypothesis) can be iteratively applied to a postulated frame of information to determine which (if any) of the selection of complex rotation constant values uncovers a frame which passes a cyclic redundancy check (CRC). This can be a brute-force operation where a cyclic redundancy check (CRC) may be performed for each hypothesis. For any valid CRC, a payload from the signal can be sent to MAC, and network parameters can be considered to be known.

In an operation 168, other slot timing hypothesis are tried. In an exemplary embodiment, the coarse AFC hypotheses associated with the most successful CRCs can be nominal starting coarse AFC hypotheses. Once the entire range of coarse AFC hypothesis are explored, the tag notes a variable called Nominal_Coarse_AFC which is the relevant state information used in future transactions which greatly narrows the range of coarse AFC hypothesis searches because the part-to-part variation of oscillator ppm deviation is much larger than the oscillator drift over the coarse of a minute or so.

Figure 6:
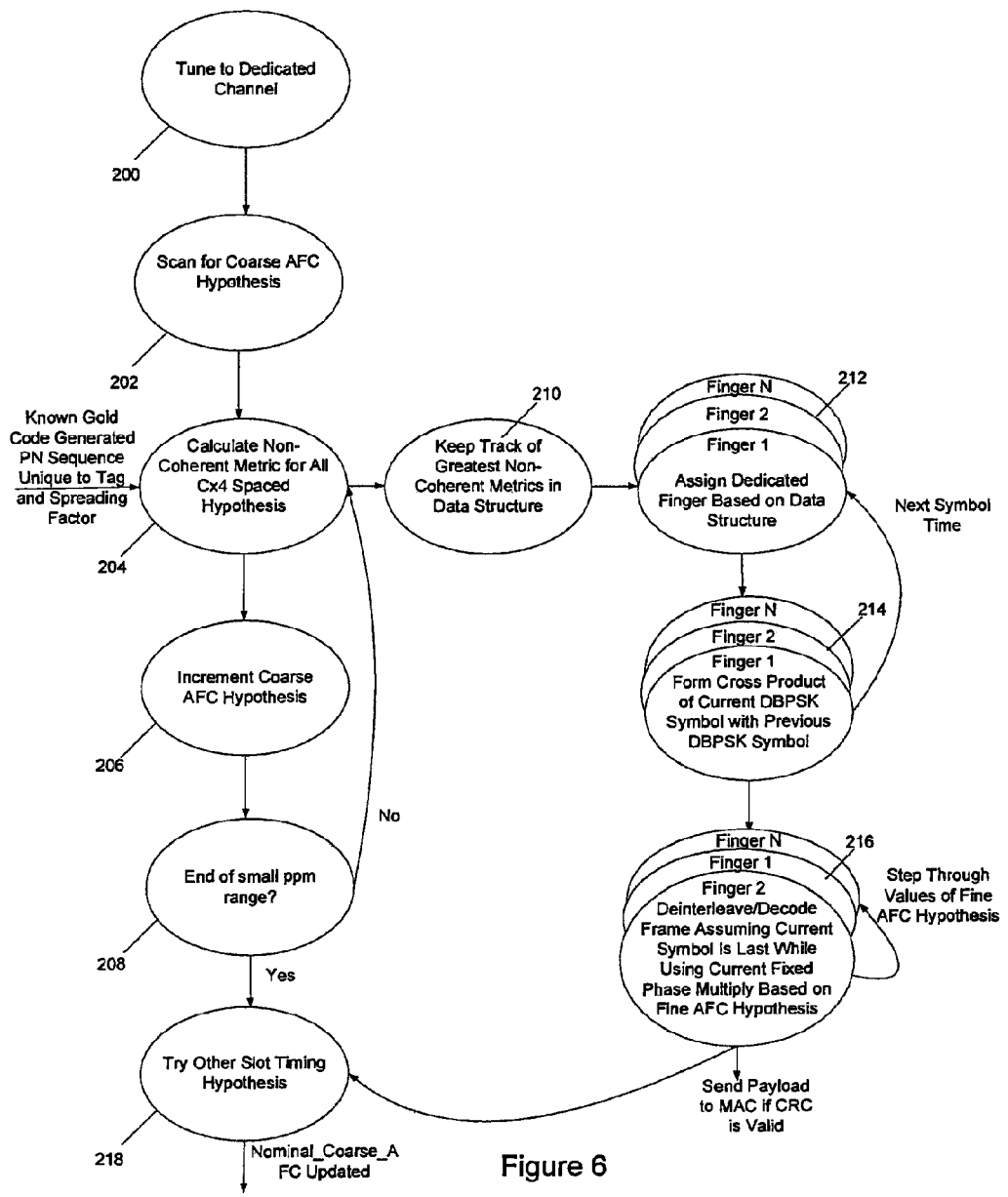
FIG. 6 is a flow diagram depicting operations performed in the tag processing of a dedicated channel from a warm start in an exemplary embodiment.

FIG. 6 illustrates operations performed in the tag processing of a dedicated channel from a warm start which is to say where relevant state information is known. For example, frame timing can be known and a much tighter range of coarse AFC hypothesis may be explored. The modem begins its processing sufficiently early so that valid finger assignments are made prior to the end of the 9 symbol preamble. Alternatively, any other number of symbols may be used.

In an operation 200, there is no need to iterate over a two slot timing hypothesis because the frame timing is known. Instead of using a broadcast channel, a dedicated channel is used. In an operation 202, a coarse AFC hypothesis is scanned. In an exemplary embodiment, the coarse AFC can be scanned over a small range to account for small frequency drift since the last time accessed. Using a known gold code generated PN sequence unique to the tag, in an operation 204, a non-coherent metric for all chip×4 spaced hypotheses is calculated. In operations 206 and 208, the coarse AFC hypothesis is incremented until the end of the small ppm range. In an operation 210, a data structure keeps track of the greatest non-coherent metrics (e.g., coarse AFC value, chip×4 timing hypothesis, non-coherent metric value, etc.) In an operation 212, dedicated fingers are assigned based on the data structure. In an operation 214, symbol cross products are created using current DBPSK and previous DBPSK. An output of operation 214 can be a complex cross product from each dedicated finger. In an operation 216, frames are interleaved and decoded. For any valid CRC, the payload can be sent to a medium access control (MAC) layer. In an operation 218, other slot timing hypothesis are tried. In an exemplary embodiment, coarse AFC hypotheses associated with the most successful CRCs can be nominal starting coarse AFC hypotheses.

FIG. 7 illustrates a tag receive data path depicting the tag's demodulation processing in accordance with an exemplary embodiment. As shown, the one-bit complex samples are buffered in a sample buffer 220 such that enough data is present to make reliable detection of valid energy. Exemplary values are provided in the sample buffer block 220. For example, one embodiment buffers 9 symbols. In alternative embodiments, other values may be used. The samples may be input from the I channel and Q channel into this ping-pong buffer scheme at the synchronous sample rate of chip×2 or 2 MHz. Alternatively, other rates may be used. At the fast asynchronous clock, these samples are used to explore the various coarse AFC hypothesis. Based on the current coarse AFC hypothesis, time-tracking is performed at chip×4 resolution. Since the same timing reference is used to drive both the carrier frequency and the sample clocks on both the AP and the tag, a coarse AFC hypothesis with a known carrier frequency can uniquely map to a known rate of time tracking.

The sample buffer 220 receives communication signals over the I channel and the Q channel. These signals are sent to time tracking logic 222 and dedicated fingers 234. The time tracking logic 222 also receives a coarse AFC hypothesis and the logic 222 may reset to zero at chip×4 parity. The time tracking logic 222 can have two blocks, one with counters initialized to zero for even chip×4 parity, and one with counters initialized to midrange (i.e., 2^25) for odd chip×4 parity. The output of time tracking logic 222 is provided to a block 224 in which virtual chip×4 phases are applied. Block 224 also can receive parity from an acquisition state machine. Automatic frequency control (AFC) rotation logic 226 is applied to an output of block 224.

Figure 8:
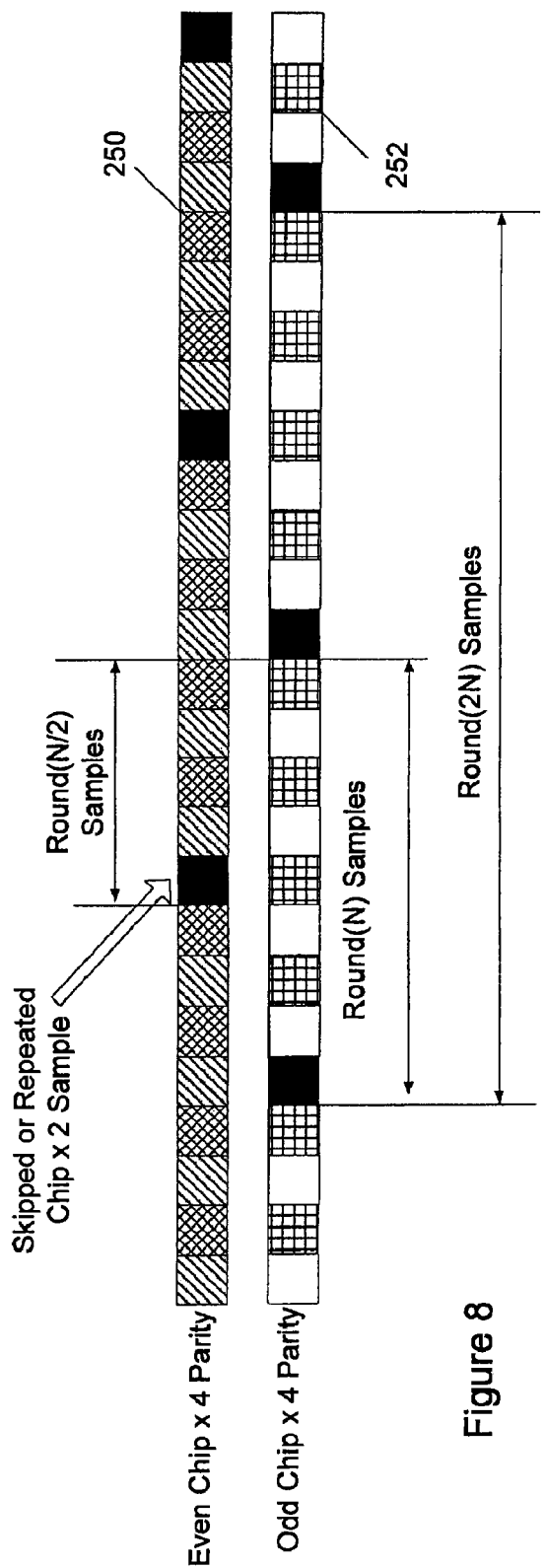
FIG. 8 is a diagram depicting time tracking in an exemplary embodiment.

FIG. 8 illustrates an exemplary embodiment of the two blocks of time tracking logic 222 described with reference to FIG. 7. Stream 250 is a communication stream with an even chip×4 parity. Stream 252 is a communication stream with an odd chip×4 parity. FIG. 8 depicts the time-tracking operation where each different shading represents a different chip×4 spaced sequence. Samples are either inserted or repeated at a rate directly depending on which current AFC hypothesis is being explored, multiplied by a known ratio between the sample rate and the carrier frequency. This can be used as a locked clock assumption to collapse a 2-dimensional space down to a single dimension. The value N depicted has a fractional component which is book-kept to allow for sufficient time-tracking precision. A particular parity of the 4 possible chip×4 phases is selected at a given time. The resultant chip rate sequence is then derotated in a 1-bit data path as shown in FIG. 9.

Figure 9:
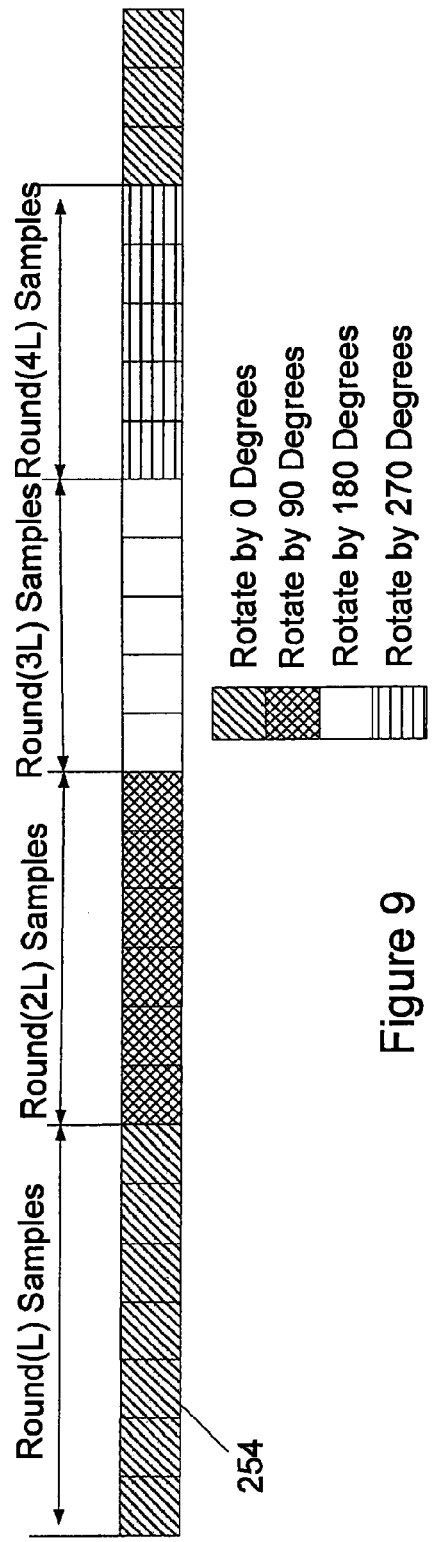
FIG. 9 is a diagram depicting an AFC (automatic frequency control) rotation in an exemplary embodiment.

FIG. 9 depicts the functionality of the AFC (automatic frequency control) rotation logic 226 of FIG. 7 which operates on one of the 4 virtual chip×4 phases 224 at a given time. FIG. 9 depicts a one-bit derotation mechanism. This derotation mechanism is designed to undo the AFC rotation due to the relative carrier drift between the receiver and transmitter for the postulated coarse AFC hypothesis. Since it's a one-bit transform (represented by the truth table illustrated above), the 90 degree resolution of the process is +/−45 degrees relative to the continuum of values of the phase due to the AFC drift from the relative oscillator offset.

The AFC rotation logic 226 can also receive coarse AFC hypotheses as an input. The PN despreading array 228 (FIG. 7) performs its despread operation for chip spaced hypothesis. The PN despreading array 228 may receive current coarse AFC hypotheses, timing parity, timing phase, spreading factor, and/or gold code selection as inputs. As the values are output for a given symbol, the sum is non-coherently accumulated for better metric reliability with the running sum stored in the non-coherent accumulation buffer 230. The size of the buffer is based on the number of despread elements. In an exemplary embodiment, the PN dispreading array 228 may have 256 despread elements such that a pass through the sample buffer completes the non-coherent metric for 256 hypotheses. Alternatively, other numbers of despread elements may be used, and the metric may be completed for other numbers of hypotheses. A signal-to-noise ratio (SNR)

metric may be used in transmission power control of the tag and for power control feedback to the AP. The hypotheses with the largest metrics are stored in a top N path data structure 232 which is used to control the assignment of the dedicated fingers 234. The top N paths can be N records including timing hypotheses, timing parity, coarse AFC hypotheses, etc.

Figure 10:
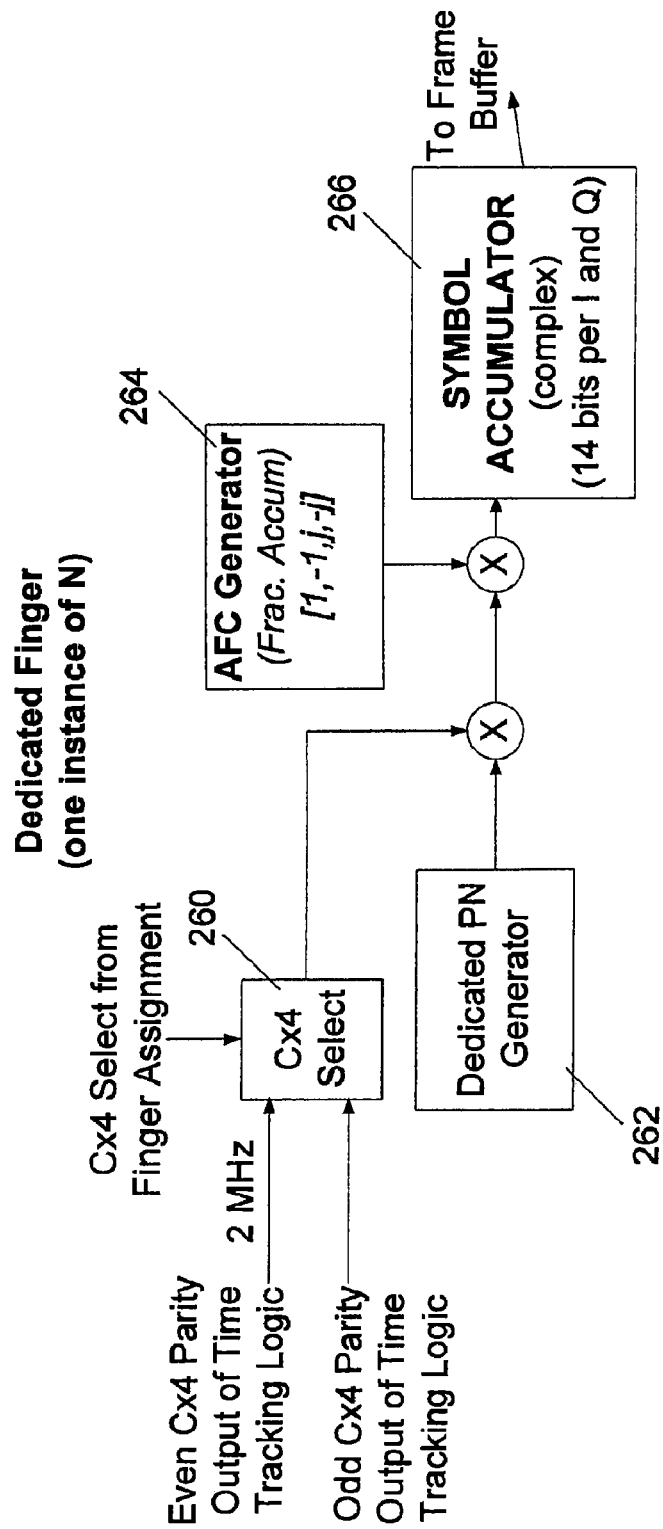
FIG. 10 is a diagram depicting a dedicated communication finger in an exemplary embodiment.

FIG. 10 illustrates a dedicated communication finger. Each dedicated finger has access to each of the 4 phases of chip×4 samples with a chip×4 selector 260 set as part of the parameters of the finger assignment. Each finger has its own dedicated PN generator 262 and AFC generator 264 which is used to despread. The dedicated finger accumulates into the symbol accumulator 266 based on the coarse AFC hypothesis, its chip×4 timing phase, the dependent variable of time-tracking rate, and then outputs a complex variable every spreading factor number of clocks. The dedicated fingers 234 illustrated with reference to FIG. 7 can also receive inputs from the sample buffer 220, and a PN code selection.

Referring again to FIG. 7, the output from the dedicated fingers 234 goes through a bit-width squeezer 236 that reduces the bit-widths for efficient storage in the frame buffer 238 without sacrificing performance. The output from the bit-width squeezer 236 is provided to the frame buffer 238, which may be a circular buffer mechanism which allows for the general case of processing a 256 symbol frame as if the current symbol is the last symbol of the frame. When frame timing is known, this memory structure can support the specific processing of a frame with the known last symbol.

Frame buffer 238 outputs the hypothesized frames to the rest of the receive chain. A cross product multiplication block 240 performs the multiplication of the current symbol with the complex conjugate of the previous symbol which is the conventional metric for D-BPSK demodulation. A residual frequency drift may cause the D-BPSK constellation to be rotated by a fixed phase. The role of the fine AFC multiply block 242 is to take a brute-force approach and try different possible phase rotations such that at least one fine AFC hypothesis yields a valid CRC as it passes through a de-interleaver and viterbi decoder 244. The fine AFC multiply block 242 can also receive fine AFC hypotheses as inputs. The output from the de-interleaver and Viterbi decoder 244 is provided to a CRC checker 246. If the CRC is valid, the payload is sent up to the MAC layer.

Figure 11:
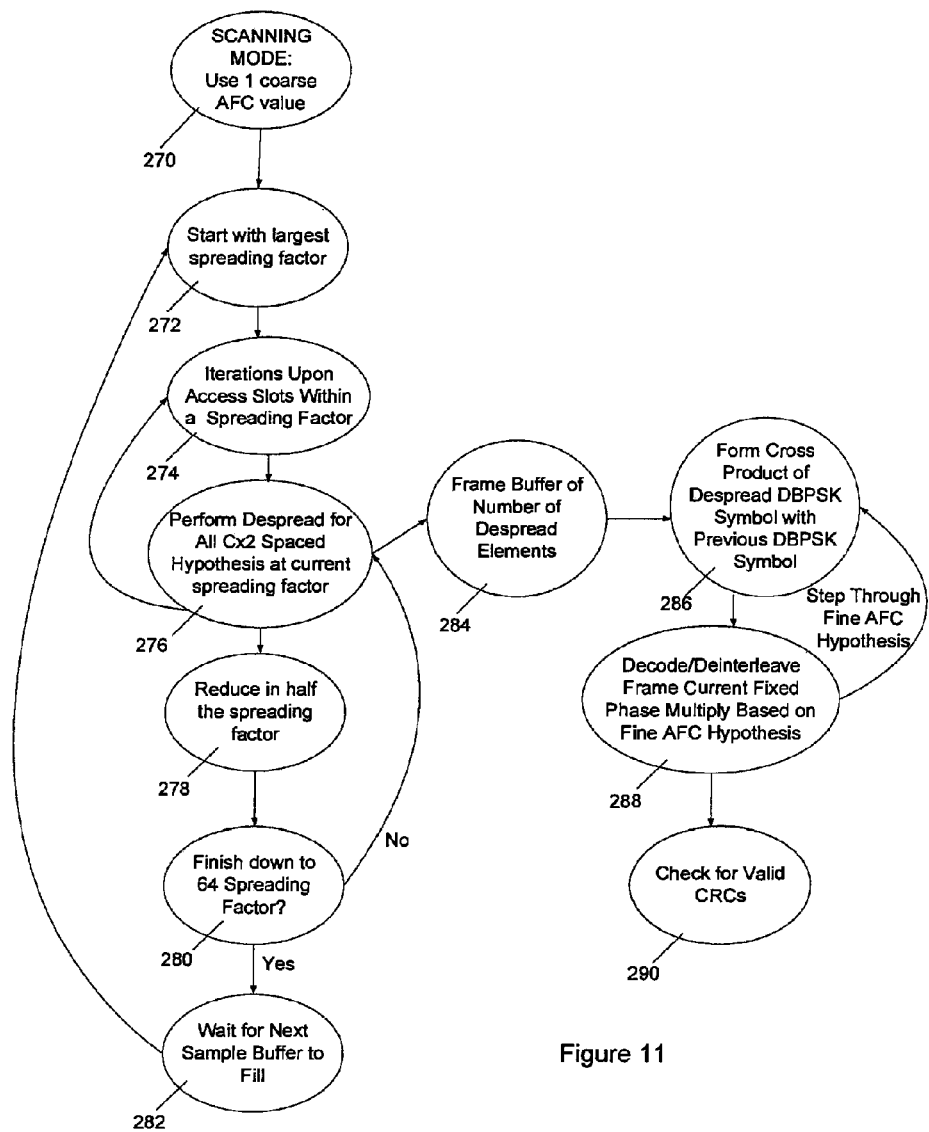
FIG. 11 is a flow diagram depicting operations performed during access point receive processing in an exemplary embodiment.

FIG. 11 depicts exemplary operations performed during access point receive processing. Additional, fewer, or different operations may be performed depending on the embodiment. Further, the operations can be performed in a different order than that which is described here. The AP performs a brute-force operation checking all possible chip×2 timing hypothesis, spreading factors, and access slots within spreading factors. This allows for uncoordinated access by the tag. Fortunately, since the AP is the master of frame-timing and AFC carrier reference (all tags can compensate both their carrier drift and sample clock to meet the AP's timing), the processing burden on the AP is drastically reduced since the AP need not explore the dimensionality of coarse AFC hypothesis or unknown frame timing.

The flowchart of FIG. 11 shows an example of the ordering of iterating upon all possible chip×2 timing offset, spreading factors from the set [8192, 4096, . . . , 64], and access slot numbers for spreading factors less than the maximum. The AP then performs the similar fine AFC search that the tag performs to allow for a small amount of frequency drift between the timing sources of the tag and the AP to occur since the last transaction. All valid CRCs are passed up to the MAC layer. The flowchart of FIG. 11 illustrates the searching of a multi-dimensional space. In an outermost loop, all possible spreading factors are searched. In an exemplary embodiment, there may be 8 spreading factors [64, 128, 256, 512, 1024, 2048, 4096, 8192]. Alternatively, other spreading factors and/or numbers of spreading factors may be used. In a second loop, all possible sub-slots for a given spreading factor are searched. For example, there may be 128 possible sub-slots for a 64 chip spreading factor and a single degenerate sub-slot for a 8192 chip spreading factor. In a third loop, all possible chip×2 timing phases within a given sub-slot are searched. As described in more detail below, the various loops are illustrated by the arrows in FIG. 11.

In an operation 270, one coarse AFC value is used. In an exemplary embodiment, the one coarse AFC value can be 0 since compensation is performed by the tags. In an operation 272, a largest spreading factor (e.g., 8192) is used as a starting point. In alternative embodiments, the largest spreading factor may be larger or smaller than 8192. In an operation 274, access slots are processed within a spreading factor. This process may be degenerate in the case in which there are 8192 spreading factors. In an operation 276, despreading is performed for all chip×2 spaced hypotheses at the current spreading factor. For example, 16,384 despread operations may be performed if the spreading factor has a length of 8192. Despread is performed for all elements unless the spreading factor is less than the frame buffer number (e.g., 256). In an operation 278, the spreading factor is reduced in half and processing continues. In an operation 280, a determination is made regarding whether the spread factor has been reduced to 64. In alternative embodiments, other predetermined values may be used. If the spread factor has not been reduced to 64 (or other predetermined value), processing continues at operation 276. If the spread factor has been reduced to 64, the system waits for a next sample buffer to fill in operation 282. Once the next sample buffer is filled in operation 282, control returns to operation 272. In an operation 284, a frame buffer of despread elements is obtained. In an exemplary embodiment, the frame buffer may be complete after 256 symbols are output from a single pass by the PN despread array. In one embodiment, for a 256 stage PN despread array, a pass through may produce 256 timing hypotheses each having 256 symbols. In alternative embodiments, the PN despread array may have more or fewer stages. A cross product of the current despread DBPSK symbol with the previous symbol is calculated in an operation 286. In one embodiment, the cross product may involve 256 symbols for up to 256 frames. Alternatively, other numbers of symbols and/or frames may be used. In an operation 288, the current frame is decoded and phase multiplied based on the AFC hypothesis. In an operation 290, CRCs are checked and for any valid CRC, the payload is sent out of the physical layer (PHY) and up to the medium access control (MAC). As an example, the CRCs may be checked for 256 times the number of fine AFC hypothesis for each pass of a 256 despread array. Upon completion of the process for a given slot, the process is performed for a subsequent slot as illustrated by the arrow from block 282 to block 272.

Figure 12:
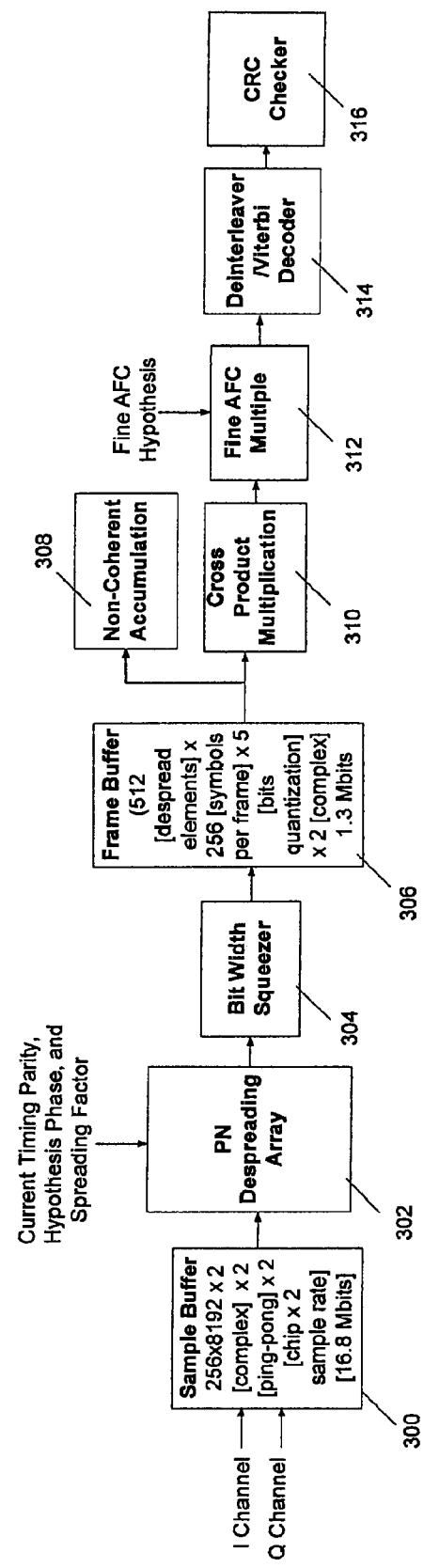
FIG. 12 is a diagram depicting an access point receive data path in an exemplary embodiment.

FIG. 12 depicts an access point (AP) receive data path. Unlike the tag, an entire frame at the largest spreading factor may be stored in a ping-pong buffer scheme in a sample buffer 300. This buffer scheme can be a substantial amount of memory (e.g., 16.8 Mbits) and in at least one embodiment, it may be stored in a dedicated off-chip memory device. The sample buffer block 300 includes exemplary values. In alternative embodiments, other values may be used. Unlike the tag, the time tracking logic and the AFC rotation logic may not be used since the AP is the master time reference. The sample buffer 300 passes frames to a PN despreading array 302, which can perform brute force testing as described previously herein. The PN despreading array 302 may include 256 despread elements. Alternatively, any other number of despread elements may be used. The PN despreading array 302 may also receive current timing parity (which may be chip×2 resolution only), hypothesis phase, and/or spreading factor as inputs. An output from the PN despreading array 302 is provided to a bit width squeezer 304. The bit width squeezer 304 reduces the size of the frames, which are then sent to a frame buffer 306. The frame buffer block 306 includes exemplary values. In alternative embodiments, other values may be used. Depending on the embodiment, the frame buffer 306 may also be stored in a dedicated off-chip memory device. The rest of the system is similar to the tag's receive processing where fine AFC hypothesis are iterated upon (operations 310 and 312) with all payloads with valid CRCs being passed up to the AP's MAC (operations 314 and 316). A non-coherent accumulation 308 is used to determine an SNR metric such as signal strength for use in transmission power-control feedback to the tag.

Figure 13:
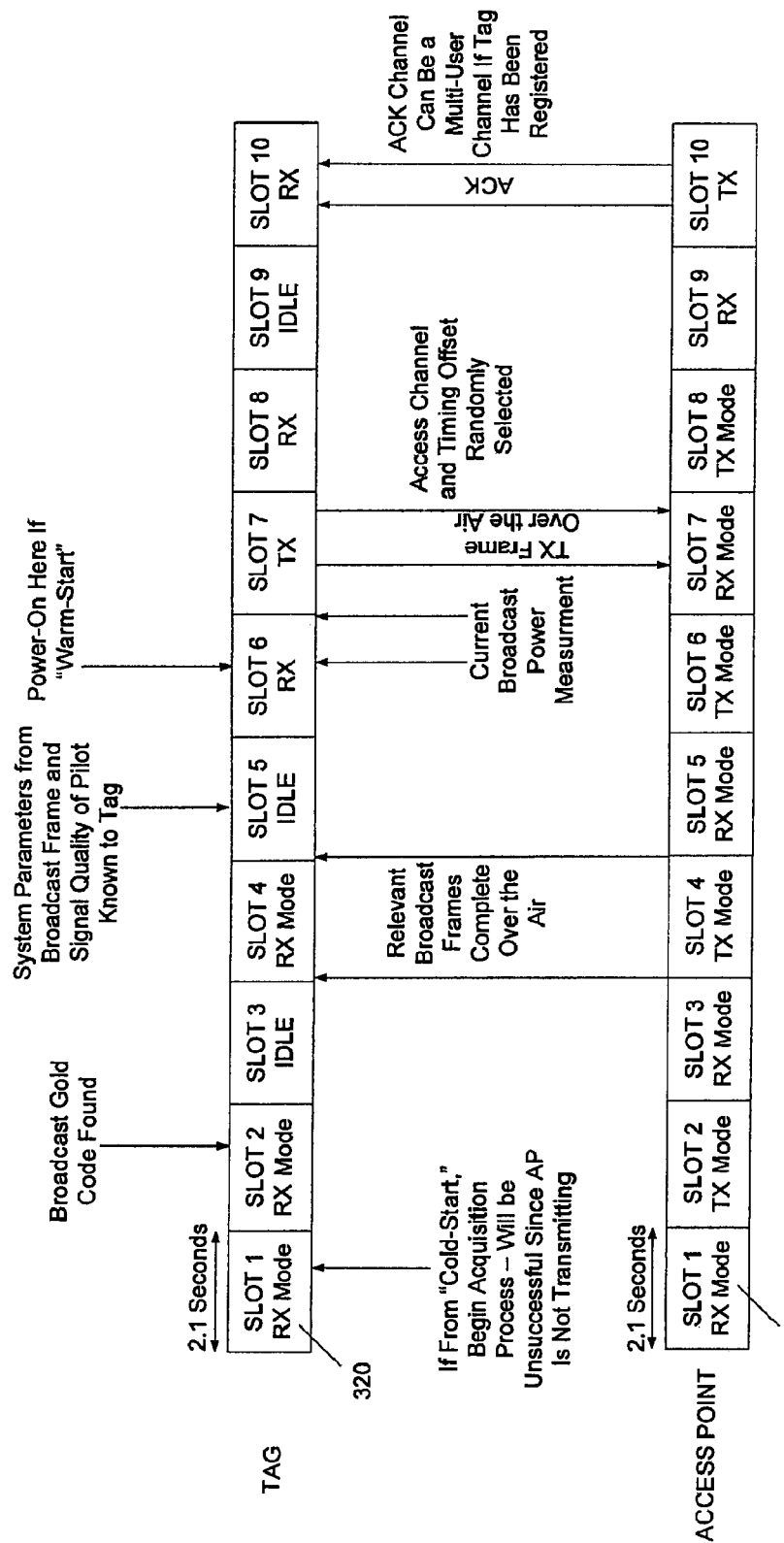
FIG. 13 is a diagram depicting asynchronous initial tag transmit operations in an exemplary embodiment.

FIG. 13 illustrates asynchronous initial tag transmit operations, including two types of interactions which result in data transfers from the tag to the AP. For purposes of illustration and discussion, slots 320 represent tag slots and slots 322 represent access point slots. "Cold Start" is where the tag is coming into the system without any relevant state information and "warm start" is where the tag is aware of the system information such as slot timing and a reduced range of coarse AFC hypothesis to explore.

In the "Cold Start" scenario, the tag begins seeking access at a slot-asynchronous point in time. FIG. 13 depicts a time where the tag begins attempting to acquire the broadcast channel when the AP isn't even transmitting it (slot 1). Eventually, the tag's processing explores the valid coarse AFC hypothesis during a period of time that the AP is transmitting the broadcast frame. FIG. 13 depicts this occurring during slot 2. At this point, the non-coherent energy metric causes a dedicated finger to explore the correct chip×4 timing and coarse AFC hypothesis. The finger with the correct hypothesis continually treats each new symbol as the last symbol of the frame and pushes these hypothesized frames through the receive chain where the CRC check indicates failure. At the end of slot 4, the valid frame timing is achieved as the CRC check indicates success. At this point, the tag has the same relevant state information that a tag entering at a "warm-start" would have and continues to complete the same processing that a "warm-start" tag would undergo.

A tag enters the interaction depicted in slot 6 ("Warm Start") either by a transition through a "Cold Start" procedure or directly upon tag wake-up if relevant state information is appropriately maintained. At this point, the tag makes a measurement of the received strength of the broadcast frame and uses this information to determine the transmit power and spreading factor that the tag subsequently transmits at in slot 7. The tag transmits it's message based on: 1) using the measured received broadcast channel signal strength and selecting the minimum spreading factor that can be used to close the link, which minimizes the tag's on time and is best for minimizing power consumption; 2) using the measured received broadcast channel signal strength and the formerly selected spreading factor, the tag transmits at the optimality condition of reception at the AP which is that all user's are received by the AP at very similar values of energy per bit to spectral noise density ratio (Eb/No); 3) for all but the maximum spreading factor, randomly selecting the slot access parameter j; and 4) randomly selecting the chip offset value from 0 to spreading factor −1 such that "collisions" at the AP are minimized and random selection at each transmission allows "collisions" to be resolved in subsequent transmission opportunities.

During slots 8 and 9, the AP processes all the signals received during slot 7 and sends a positive acknowledgement back during slot 10. The AP either aggregates several ACKs into a single channel characterized by a gold code, or sends a dedicated message to the tag using its dedicated gold code channel. Note that the former method requires some registration procedure (not shown) to assign the channel. In either case, the tag updates its chip×4 timing using the preamble of the message.

Figure 14:
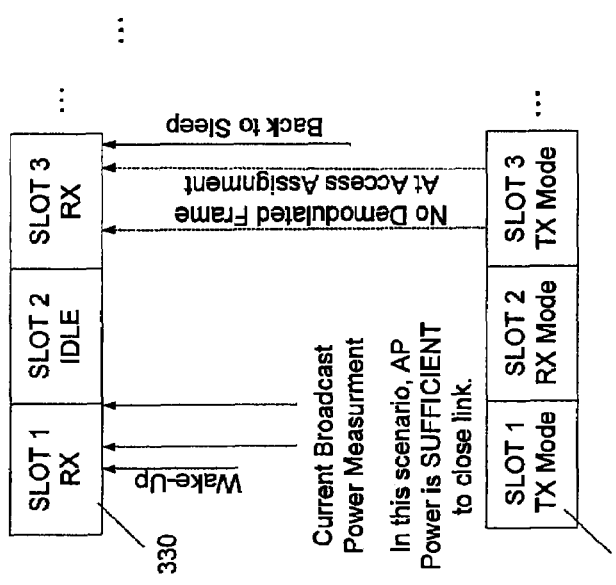
FIG. 14 is a diagram depicting interactions between an access point and a tag in a slotted mode according to an exemplary embodiment.

FIG. 14 illustrates a simple interaction between an access point and a tag in a slotted mode. In an exemplary embodiment, the simple interaction involves no data for the tag and a relatively static channel. For purposes of illustration and discussion, timeline 330 represents tag processing during the slots and timeline 332 represents access point processing during slots. The nature of the system is that the tag spends a maximum possible time in a low-power state—a state where system timing is maintained via a low-power, low-frequency crystal oscillator which is typically 32 kHz. To support this, a maximum tolerable latency upon AP initiated interaction is identified (i.e., this is the rate cycling in and out of the low power state for the tag to check if any AP action is pending). FIG. 14 shows the relatively simple interaction of a tag coming out of it's low power state to check if the AP is wanting to initiate a transaction. This occurs at a slot phase and rate agreed upon between the AP and the tag during registration.

The tag would typically enter a "warm start" where the frame timing and coarse AFC hypothesis are known to within a tight range. The tag makes a measurement of the received broadcast channel power. FIG. 14 shows the scenario where that power has not changed considerably since the last interaction with the AP. This means that the last transmit power/spreading factor that the AP transmitted at is sufficient to close the link. In slot 3, the tag attempts to acquire on the preamble and then demodulate the frame using its dedicated gold code. A typical scenario is the AP not having sent information and the tag immediately goes back to sleep.

Figure 15:
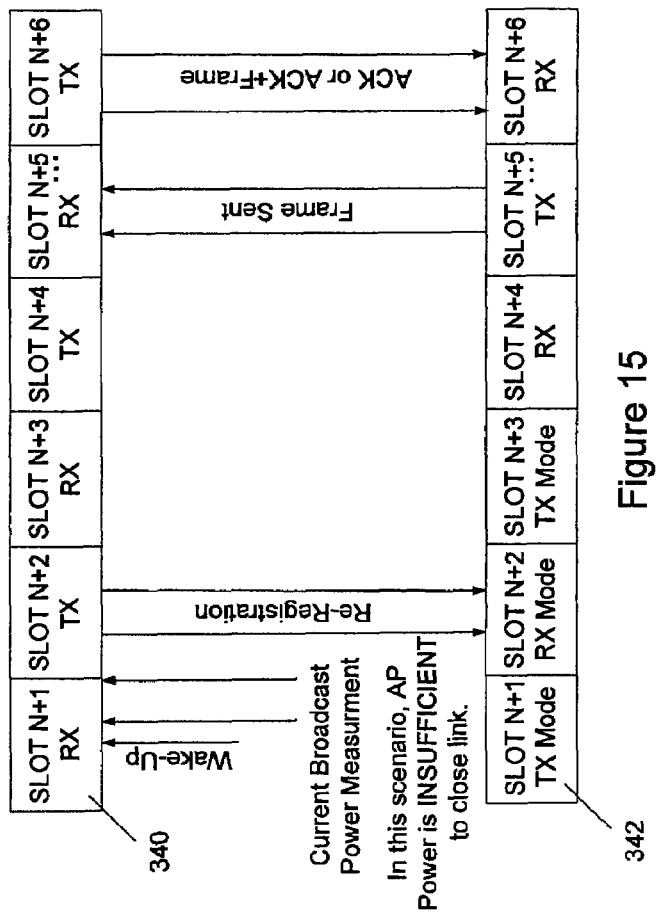
FIG. 15 is a diagram depicting data transfer between an access point and a tag according to an exemplary embodiment.

FIG. 15 depicts a more complicated interaction which involves data transfer and dynamically changing propagation between an access point and a tag according to an exemplary embodiment. For purposes of illustration and discussion, timeline 340 represents tag processing during the slots and timeline 342 represents access point (AP) processing during the slots. Here, the AP has information to send and the propagation of the channel has changed considerably since the last AP transaction. The current broadcast channel power measurement has changed such that the tag knows that the subsequent transmission would not be appropriate if it transmits at the same transmit power/spreading factor as last time. Thus, the tag will send a re-registration message using the protocol explained in FIG. 13 to alert the AP to use a new transmit power/spreading factor appropriate to the current channel conditions. The new information governs the transmission and reception of the frame occurring in slot N+5. The tag generates an acknowledgement (ACK) message governed by the protocol of FIG. 13 to indicate a successful transmission. If the ACK is successfully received, the transaction is considered complete. Otherwise, the tag attempts a retransmission.

Figure 16:
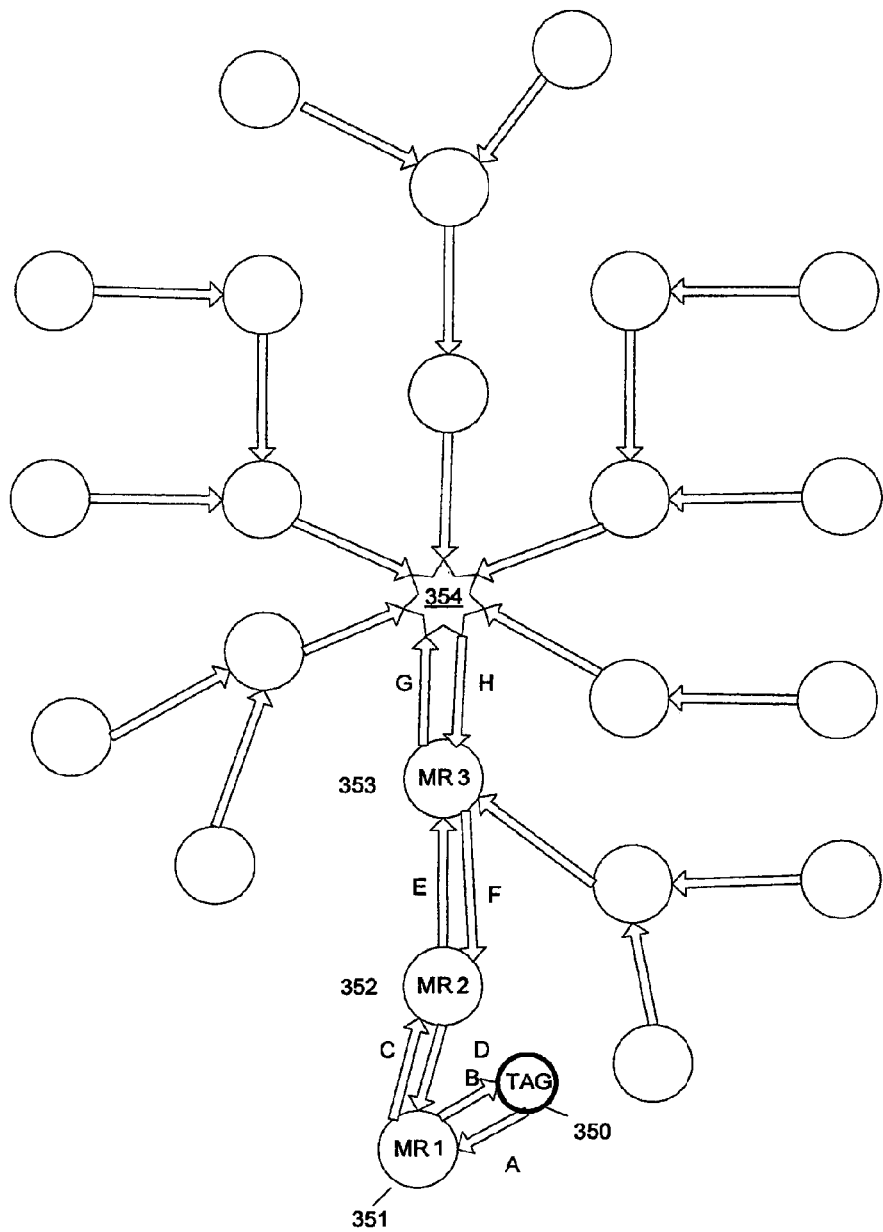
FIG. 16 is a diagram depicting a mesh network formed with RPMA devices.

FIG. 16 illustrates how tags may be connected together into a mesh network. Tag 350 has a communication link to micro-repeater 351 which itself connects to other micro-repeaters 352 and 353 before connecting to access point 354. The communication links between these elements are bi-direction, half-duplex links that use the same communication protocol as outlined above.

The network can be formed dynamically through the following representative embodiment. Each device in the network has a seed value. The access point has a seed value of 0. Each subsequent device has a seed value that equals the number of connections it is away from the access point. For example, in FIG. 16, micro-repeater 353 is one connection away from the access point 354 and so has a seed value equal to 1; micro-repeater 351 is three connections away from the access point 354 so has a seed value equal to 3.

Each micro-repeater and the access point can transmit on a broadcast channel. Initially, only the access point is transmitting on the broadcast channel. As each micro-repeater associates with the network, the micro-repeater can then transmit a broadcast channel to other devices. For example, in FIG. 16, access point 354 and micro-repeaters 353, 352, and 352 can all transmit on the broadcast channel because they are associated with the network. The seed value of each device is transmitted in messages on the broadcast channel. Hence, an unassociated micro-repeater can set its own seed value to the seed value of the received broadcast channel message plus 1.

Figure 17:
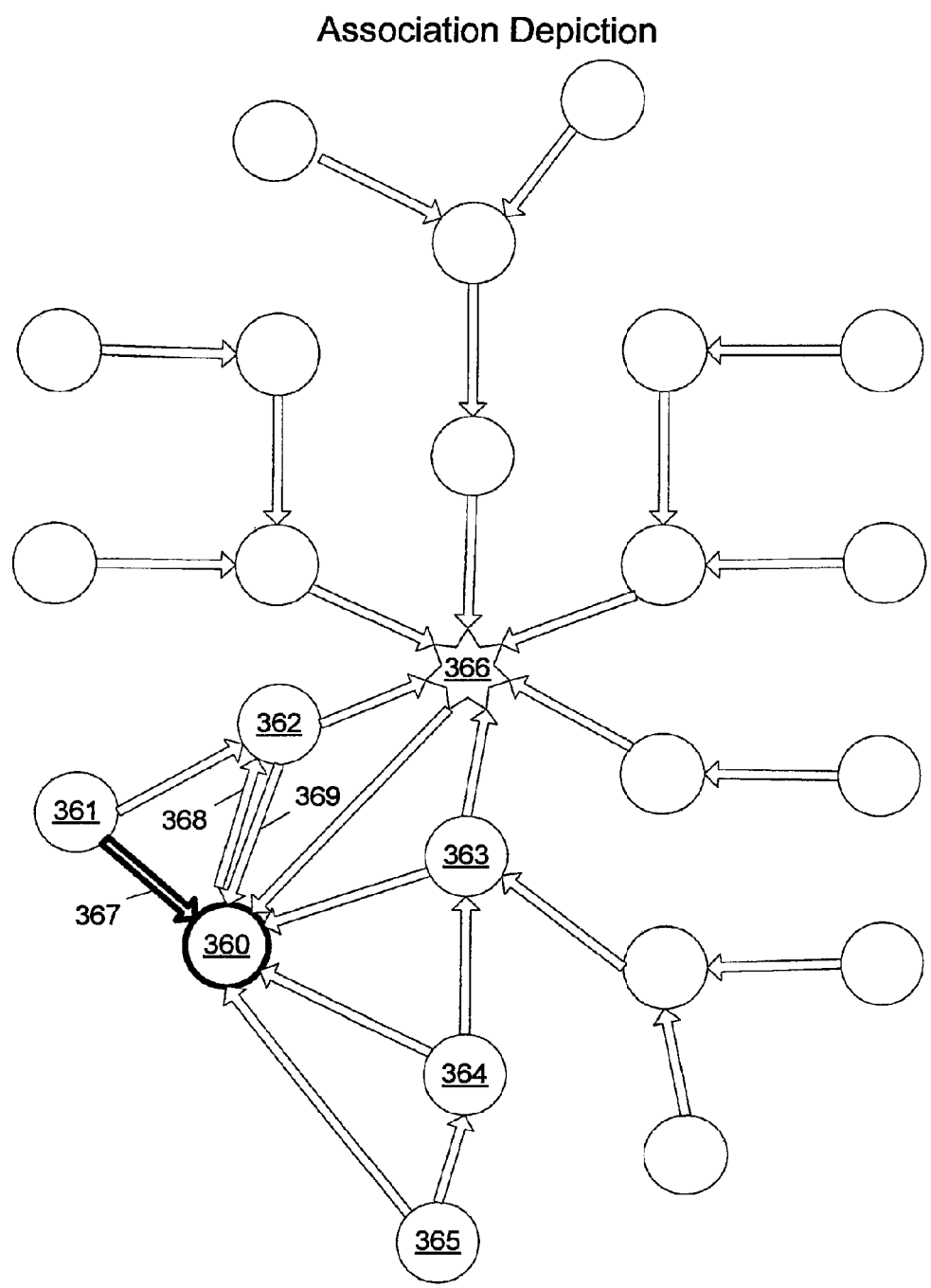
FIG. 17 is a diagram depicting the association of a micro-repeater to a mesh network formed with RPMA devices.

FIG. 17 illustrates how a particular micro-repeater could associate with the network. Micro-repeater 360 begins the association process by listening to the broadcast channel. Micro-repeaters 361, 362, 363, 364, and 365 are also in the area. The access point 366 is also nearby. The strongest link that micro-repeater 360 can receive is link 367. Other links shown can also be received by micro-repeater 360. Micro-repeater 360 tends to acquire initially on the strongest signal received, which is link 367. Through a process like the one above, micro-repeater 360 obtains frame timing and relative reference crystal deviation from the network timing. Micro-repeater 360 switches to receive mode to acquire all of the other links that it can. Micro-repeater 360 may select the micro-repeater with the lowest seed over a certain threshold. Micro-repeater 360 may use other factors to determine which micro-repeater to select.

Once micro-repeater 360 determines which other micro-repeater it associates with, it may then transmit to micro-repeater 362 for permission to associate via link 368. Micro-repeater 362 may then respond to grant association.

Once association is granted other messages may be transmitted between the micro-repeaters. Micro-repeaters with lower numbered seed values may transmit various messages to micro-repeaters with higher numbered seed values including those needed to keep AFC and sample timing compensation consistent through the network. For example, in FIG. 17, micro-repeater 362 could transmit AFC compensation messages to micro-repeater 360. All micro-repeaters may transmit control messages to appropriately power control transmissions from associated micro-repeaters. Micro-repeaters 362 and 360 can both transmit power control transmission to each other. Failure to receive some number of consecutive messages from upstream micro-repeaters may trigger the micro-repeater to go back into acquisition mode and potentially find a different micro-repeater to associate with. If micro-repeater 360 stops receiving some number of consecutive messages from micro-repeater 362, it may go back into acquisition more and associate with a potentially different micro-repeater. After the micro-repeater has associated with the network, it transmits on the broadcast channel advertising its own seed to other devices seeking to join the network including other micro-repeaters or tags. The messages broadcast by the micro-repeater may be at a set broadcast power so as to allow as many devices as possible to determine if this micro-repeater is available for networking. For example, after association, micro-repeater 360 may now transmit on the broadcast channel to advertise itself to other devices seeking to join the network.

Upstream communication originating from a tag is passed from each micro-repeater to the micro-repeater it is associated with that has a lower seed value. For example, in FIG. 16, micro-repeater 352 passes traffic originating at tag 350 and received from micro-repeater 351 on to micro-repeater 353 enroute to access point 354. Ultimately, the micro-repeaters with a seed value of 1 transmit the message to the access point. Micro-repeater 353 passes tag originating traffic on to access point 354. Tags may communicate with whichever micro-repeater requires the least transmit power so as to save battery life, even if this results in communicating with a micro-repeater with a higher seed value. Tag 350 may be able to communicate to either micro-repeater 352 or 351, but tag 350 may pick to communicate with micro-repeater 351 based on needing the least transmit power to communicate with micro-repeater 351. Communications, regardless of direction, are transmitted using a gold code that corresponds to the seed value of the destination.

Downstream communication may be routed by each micro-repeater to the micro-repeater closer to the tag. Micro-repeater 353 passes traffic originating at access point 354 that is bound for tag 350 on to micro-repeater 352. This information may be captured in a data structure during upstream communication from the tag to the access point that has previously passed through the micro-repeater. Many known methods of routing can be used with a system embodied under the claimed invention. In one routing method, entries for particular routes in the data structure may contain both an identification of the device and the seed value of the next communication link that leads to the device. Micro-repeater 353 may have entries for a route to tag 350 in a data structure. Entries in the data structure may also note when the device is in direct communication with the micro-repeater. Micro-repeater 351 could note that it is in direct communication with tag 350. The gold code used to pass on a routed message depends on entries in the data structure. The micro-repeater may transmit using either a gold code corresponding to a further downstream micro-repeater or a gold code corresponding directly to the device. Hence, micro-repeater 351 would communicate with tag 350 using a gold code that corresponds directly to the device. Messages received for devices that are not known in the data structure may need to be transmitted back upstream. When the access point has no record of the device, the access point may either wait for a message from the tag or may issue a broadcast channel message seeking the tag directly.

Tag communication to micro-repeaters may be essentially unchanged from the direct tag to access point topology described above. Broadcast messages that tags use for initialization may be broadcast using an agreed upon network wide gold code that is independent of the micro-repeater seed. Hence, when tag 350 attempts to associate with the network, it may use a network wide gold code. Power control communications can be performed with the micro-repeaters just as the tag could perform these with an access point as explained above.

It may be desirable to have the tag itself act as a micro-repeater under certain circumstances. To accomplish this, the tag may transmit a broadcast channel message that advertises its presence to other tags. Hence, if tag 350 were to act as a micro-repeater, tag 350 could transmit a broadcast channel message advertising itself to other tags. The two tags could then function in much the same way that a micro-repeater and tag normally function. In one embodiment, a tag may only issue broadcast channel messages a particular percentage of the time.

The foregoing description of exemplary embodiments has been presented for purposes of illustration and description. It is not intended to be exhaustive or to limit the present invention to the precise form disclosed, and modifications and variations are possible in light of the above teachings or may be acquired from practice of the present invention. The embodiments were chosen and described in order to explain the principles of the present invention and its practical application to enable one skilled in the art to utilize the present invention in various embodiments and with various modifications as are suited to the particular use contemplated. In addition, one or more flow diagrams were used herein. The use of flow diagrams is not intended to be limiting with respect to the order in which operations are performed.

What is claimed is:

1. A method for communicating information to an access point, the method comprising:
    generating a data stream at a processor;
    spreading the data stream with a common pseudo-noise (PN) code, wherein the common PN code is used by a plurality of tags in communication with the access point;
    applying a frequency offset to the spread data stream based at least in part on a timing of the access point; and
    transmitting the spread data stream with a randomly selected timing offset.

2. The method of claim 1, wherein the common PN code comprises a gold code.

3. The method of claim 1, further comprising receiving an acknowledgement, wherein the acknowledgement indicates that a transmission of the spread data stream is successful.

4. The method of claim 1, further comprising re-transmitting the spread data stream with a second randomly selected timing offset if an acknowledgement is not received within a predetermined time period.

5. The method of claim 1, wherein the data stream is spread with a spreading factor of 64, 128, 256, 512, 1024, 2048, 4096, or 8192.

6. The method of claim 1, wherein the spread data stream is transmitted in a randomly selected sub-slot of a transmit slot.

7. The method of claim 1, wherein the randomly selected timing offset is between zero and a spreading factor minus one.

8. A transmit apparatus for communicating information to an access point, the transmit apparatus comprising:
    a pseudo-noise (PN) spreader configured to receive a data stream and spread the data stream with a common PN code, wherein the common PN code is used by a plurality of tags in communication with the access point;
    a frequency control rotator in communication with the PN spreader and configured to apply a frequency offset to the spread data stream based at least in part on a timing of the access point;
    a delay module in communication with the frequency control rotator and configured to generate a randomly selected timing offset for the spread data stream; and
    a transmitter configured to transmit the spread data stream with the randomly selected timing offset.

9. The transmit apparatus of claim 8, wherein the common PN code comprises a gold code.

10. The transmit apparatus of claim 8, further comprising an encoder configured to encode the data stream.

11. The transmit apparatus of claim 8, wherein the transmitter is further configured to re-transmit the spread data stream with a second randomly selected timing offset if an acknowledgement is not received within a predetermined time period.

12. The transmit apparatus of claim 8, wherein the data stream is spread with a spreading factor of 64, 128, 256, 512, 1024, 2048, 4096, or 8192.

13. The transmit apparatus of claim 8, wherein the transmitter is further configured to transmit the spread data stream in a randomly selected sub-slot of a transmit slot.

14. The transmit apparatus of claim 8, wherein the randomly selected timing offset is between zero and a spreading factor minus one.

15. A tag for communicating information to an access point, wherein the tag comprises:
    a transmit apparatus comprising
        a pseudo-noise (PN) spreader configured to receive a data stream and spread the data stream with a common PN code, wherein the common PN code is used by a plurality of tags in communication with the access point;
        a frequency control rotator in communication with the PN spreader and configured to apply a frequency offset to the spread data stream based at least in part on a timing of the access point;
        a delay module in communication with the frequency control rotator and configured to generate a randomly selected timing offset for the spread data stream; and
        a transmitter configured to transmit the spread data stream with the randomly selected timing offset;
    a processor in communication with the transmit apparatus, wherein the processor is configured to execute operations performed by the transmit apparatus; and
    a receiver in communication with the processor.

16. The tag of claim 15, wherein the receiver is configured to receive an acknowledgement, and further wherein the acknowledgement indicates that a transmission of the spread data stream is successful.

17. The tag of claim 16, wherein the transmitter is further configured to re-transmit the spread data stream with a second randomly selected timing offset if the acknowledgement is not received within a predetermined time period.

18. The tag of claim 15, wherein the data stream is spread with a spreading factor of 64, 128, 256, 512, 1024, 2048, 4096, or 8192.

19. The tag of claim 15, wherein the transmitter is further configured to transmit the spread data stream in a randomly selected sub-slot of a transmit slot.

20. The tag of claim 15, wherein the randomly selected timing offset is between zero and a spreading factor minus one.

* * * * *